(12) United States Patent
Pan et al.

(10) Patent No.: US 12,014,976 B2
(45) Date of Patent: Jun. 18, 2024

(54) CHIP PACKAGE STRUCTURE INCLUDING A SILICON SUBSTRATE INTERPOSER AND METHODS FOR FORMING THE SAME

(71) Applicant: Taiwan Semiconductor Manufacturing Company Limited, Hsinchu (TW)

(72) Inventors: Kuo Lung Pan, Zhunan Township (TW); Yu-Chia Lai, Zhunan Township (TW); Teng-Yuan Lo, Hsinchu (TW); Mao-Yen Chang, Kaohsiung (TW); Po-Yuan Teng, Hsinchu (TW); Chen-Hua Yu, Hsinchu (TW); Chung-Shi Liu, Hsinchu (TW); Hao-Yi Tsai, Hsinchu (TW); Tin-Hao Kuo, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/191,147

(22) Filed: Mar. 28, 2023

(65) Prior Publication Data
US 2023/0253300 A1    Aug. 10, 2023

Related U.S. Application Data

(62) Division of application No. 17/205,621, filed on Mar. 18, 2021, now Pat. No. 11,646,255.

(51) Int. Cl.
*H01L 23/495* (2006.01)
*H01L 21/48* (2006.01)
(Continued)

(52) U.S. Cl.
CPC .... *H01L 23/49822* (2013.01); *H01L 21/4857* (2013.01); *H01L 23/3121* (2013.01);
(Continued)

(58) Field of Classification Search
CPC ... H01L 21/4857; H01L 25/50; H01L 25/162; H01L 25/0753; H01L 25/0756
(Continued)

(56) References Cited

U.S. PATENT DOCUMENTS 8,779,606 B2 * 7/2014 Yim .................. H01L 24/81
257/777
9,735,131 B2    8/2017 Su et al.
(Continued)

*Primary Examiner* — Nitin Parekh
(74) *Attorney, Agent, or Firm* — The Marbury Law Group, PLLC

(57) ABSTRACT

A chip package structure includes an interposer structure that contains a package-side redistribution structure, an interposer core assembly, and a die-side redistribution structure. The interposer core assembly includes at least one silicon substrate interposer, and each of the at least one silicon substrate interposer includes a respective silicon substrate, a respective set of through-silicon via (TSV) structures vertically extending through the respective silicon substrate, a respective set of interconnect-level dielectric layers embedding a respective set of metal interconnect structures, and a respective set of metal bonding structures that are electrically connected to the die-side redistribution structure. The chip package structure includes at least two semiconductor dies that are attached to the die-side redistribution structure, and an epoxy molding compound (EMC) multi-die frame that laterally encloses the at least two semiconductor dies.

20 Claims, 22 Drawing Sheets

(51) Int. Cl.
  *H01L 23/00* (2006.01)
  *H01L 23/31* (2006.01)
  *H01L 23/498* (2006.01)
  *H01L 25/00* (2006.01)
  *H01L 25/16* (2023.01)

(52) U.S. Cl.
  CPC .. *H01L 23/49816* (2013.01); *H01L 23/49827* (2013.01); *H01L 23/562* (2013.01); *H01L 25/16* (2013.01); *H01L 25/50* (2013.01)

(58) Field of Classification Search
  USPC .......................................................... 257/668
  See application file for complete search history.

(56) References Cited

U.S. PATENT DOCUMENTS

| | | |
|---|---|---|
| 9,991,219 B2 | 6/2018 | Seol et al. |
| 2010/0133704 A1* | 6/2010 | Marimuthu ......... H01L 23/3128 257/E23.116 |
| 2011/0204505 A1 | 8/2011 | Pagaila et al. |
| 2012/0211885 A1 | 8/2012 | Choi et al. |
| 2013/0062761 A1* | 3/2013 | Lin ....................... H01L 21/565 257/737 |
| 2013/0270682 A1 | 10/2013 | Hu et al. |
| 2014/0063768 A1 | 3/2014 | Tanaka et al. |
| 2015/0014688 A1* | 1/2015 | Woychik ................ H01L 22/14 257/737 |
| 2015/0091179 A1 | 4/2015 | Shenoy et al. |
| 2015/0262972 A1 | 9/2015 | Katkar et al. |
| 2016/0086930 A1 | 3/2016 | Koey et al. |
| 2016/0329272 A1 | 11/2016 | Geissler et al. |
| 2017/0188458 A1 | 6/2017 | Hsieh et al. |
| 2019/0244947 A1* | 8/2019 | Yu .......................... H01L 24/92 |
| 2020/0006241 A1* | 1/2020 | Wu ..................... H01L 23/3128 |
| 2020/0273840 A1 | 8/2020 | Elsherbini et al. |
| 2021/0035877 A1 | 2/2021 | Wu et al. |

* cited by examiner

CHIP PACKAGE STRUCTURE INCLUDING A SILICON SUBSTRATE INTERPOSER AND METHODS FOR FORMING THE SAME

RELATED APPLICATION

This application is a divisional application of U.S. application Ser. No. 17/205,621, entitled "Chip Package Structure Including a Silicon Substrate Interposer and Methods for Forming the Same," filed on Mar. 18, 2021, the entire contents of which are incorporated herein by reference for all purposes.

BACKGROUND

Integration of a system-on-chip (SoC) die and high bandwidth memory (HBM) dies into a single package may provide high performance by enabling intra-chip communication between the SoC die and the HBMs. However, performance of such an assembly of the SoC die and the HBM dies may be limited by the bandwidth of signal transfer between the SoC die and the HBM dies. Generally, the number of wiring levels as well as the line width of the wiring interconnects in a redistribution structure poses an upper limit to the bandwidth of the transfer between the SoC die and the HBM dies. Typically, the line width of the wiring interconnects in the redistribution structure is on the order of about 10 microns, and the bandwidth of signal transfer is accordingly limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
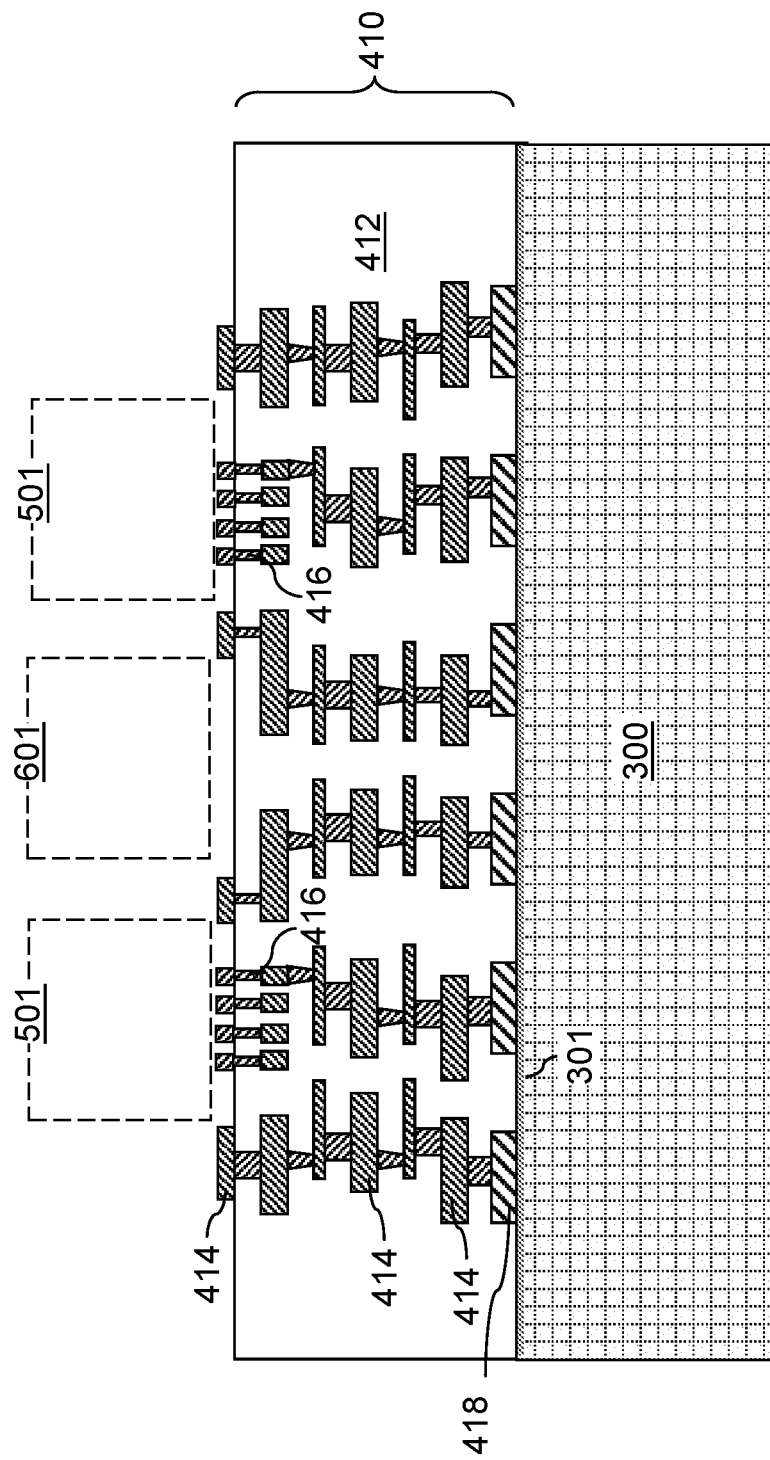
FIG. 1 is a vertical cross-sectional view of an exemplary structure during formation of a package-side redistribution structure over a carrier substrate according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to chip package structures including a silicon substrate interposer and methods for forming the same. Generally, the methods and structures of the present disclosure may be used to provide an interposer structure that incorporates a silicon substrate interposer. The interposer structure includes an interposer core assembly and redistribution structures formed on both sides of the interposer core assembly. The interposer core assembly includes a silicon substrate interposer and additional structures such as integrated passive device or through-integrated-fan-out via structures. The silicon substrate interposer may comprise a silicon substrate, through-substrate via (TSV) structures, and metal interconnect structures embedded in dielectric material layers. The silicon substrate interposer may provide vertical signal paths that include the TSV structures and horizontal interconnection paths that include metal interconnect structures embedded in the dielectric material layers. The TSV structures may be provided in a high density array configuration to provide wide bandwidth connections between semiconductor dies and a package substrate. The metal interconnect structures may be configured to provide high bandwidth chip-to-chip signal paths to and from multiple semiconductor chips. The silicon interposer structure may be incorporated into an interposer structure that include redistribution structures on both sides. The interposer structure may be used to provide high-speed high-bandwidth interconnections to and from semiconductor dies and between the semiconductor dies and a package substrate. The various aspects of the methods and structures of embodiments of the present disclosure are now described with reference to the accompanying drawings.

Referring to FIG. 1, a region of an exemplary structure that corresponds to a unit die area is illustrated. A unit die area refers to the area of a single die within a structure that includes a plurality of die areas. The plurality of die areas may be arranged as a two-dimensional array of die areas. While the drawings of the present disclosure illustrated only a single die area, multiple dies including a respective interposer structure may be formed over a single carrier substrate 300. The dies may be subsequently diced to provide multiple interposer structures. In other words, the in-process interposer structure (i.e., the interposer structure during a manufacturing process that undergoes subsequent modification in structure) illustrated in the drawings of the instant application may be a single instance among a two-dimensional array of instances of the in-process interposer structure. Multiple instances of the in-process interposer structure may be repeated in a two-dimensional array configuration over the carrier substrate 300 until the carrier substrate 300 is detached and an assembly of the multiple instances of the in-process interposer structure is diced.

In one embodiment, the carrier substrate 300 may have a diameter in a range from 150 mm to 450 mm, or may be provided as a panel such as rectangular panel. An adhesive layer 301 may be applied on the top surface of the carrier substrate 300. In one embodiment, the carrier substrate 300 may include an optically transparent material such as glass or sapphire. In such an embodiment, the adhesive layer 301 may include a light-to-heat conversion (LTHC) layer. The LTHC layer may be a solvent-based coating applied using a spin coating method. The LTHC layer may convert ultraviolet light to heat, which may cause the material of the LTHC layer to lose adhesion. For example, the LTHC layer may include Light-To-Heat Conversion (LTHC) Release Coating Ink™ that is commercially available from The 3M Company®. Alternatively, the carrier substrate 300 may be an optically opaque substrate such as a semiconductor substrate or a stainless steel substrate. In such an embodiment, the adhesive layer 301 may include a thermally decomposing adhesive material. For example, the adhesive layer 301 may include an acrylic pressure-sensitive adhesive that decomposes at an elevated temperature. The debonding temperature of the thermally decomposing adhesive material may be in a range from 150 degrees to 200 degrees.

Package-side redistribution structures 410 may be formed over the carrier substrate 300. The package-side redistribution structures 410 are a subset of redistribution structures that may be formed on the side to which a package substrate is to be subsequently attached with respective an interposer core assembly to be subsequently formed. Specifically, a package-side redistribution structure 410 may be formed within each die area over the carrier substrate 300. Each package-side redistribution structure 410 may include package-side redistribution dielectric layers 412, package-side redistribution wiring interconnects 414, and package-side bonding pads 418.

The package-side bonding pads 418 may be formed on the adhesive layer 301. For example, a copper seed layer may be deposited on the adhesive layer 301 by sputtering (i.e., physical vapor deposition). The thickness of the copper seed layer may be in a range from 50 nm to 500 nm. A photoresist layer (not shown) may be applied over the copper seed layer, and may be lithographically patterned to form openings within each dies in the pattern of an array of bonding pads. Copper may be electroplated within the openings in the photoresist layer. The thickness of the electroplated copper may be in a range from 5 microns to 50 microns, such as from 10 microns to 20 microns, although lesser and greater thicknesses may also be used.

The package-side bonding pads 418 may have horizontal cross-sectional shapes of rectangles, rounded rectangles, or circles. The photoresist layer may be removed by ashing, and horizontal portions of the copper seed layer between electroplated copper portions may be etched back, for example, using a wet etch process. Remaining discrete portions of copper comprise the package-side bonding pads 418, which are bonding pads that are subsequently used to attach solder material portions to be bonded to a package substrate.

The package-side redistribution dielectric layers 412 include a respective dielectric polymer material such as polyimide (PI), benzocyclobutene (BCB), or polybenzobisoxazole (PBO). Each package-side redistribution dielectric layer 412 may be formed by spin coating and drying of the respective dielectric polymer material. The thickness of each package-side redistribution dielectric layer 412 may be in a range from 2 microns to 40 microns, such as from 4 microns to 20 microns. Each package-side redistribution dielectric layer 412 may be patterned, for example, by applying and patterning a respective photoresist layer thereabove, and by transferring the pattern in the photoresist layer into the package-side redistribution dielectric layer 412 using an etch process such as an anisotropic etch process. The photoresist layer may be subsequently removed, for example, by ashing.

Each of the package-side redistribution wiring interconnects 414 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness of at least 50 nm, and the copper seed layer may have a thickness in a range from 100 nm to 500 nm. The metallic fill material for the package-side redistribution wiring interconnects 414 may include copper, nickel, or copper and nickel. Other suitable materials are within the contemplated scope of disclosure.

The thickness of the metallic fill material that is deposited for each package-side redistribution wiring interconnect 414 may be in a range from 2 microns to 40 microns, such as from 4 microns to 20 microns, although lesser or greater thicknesses may also be used. The total number of levels of wiring in each package-side redistribution structure 410 (i.e., the levels of the package-side redistribution wiring interconnects 414) may be in a range from 1 to 12, such as from 2 to 8. The total height of the package-side redistribution structure 410 may be in a range from 30 microns to 300 microns, although lesser and greater heights may also be used.

In one embodiment, the thicknesses of the package-side redistribution dielectric layers 412 and the package-side redistribution wiring interconnects 414 may be selected such that package-side redistribution wiring interconnects 414 provided at different wiring levels have different thicknesses. Thick package-side redistribution wiring interconnects 414 may be used to provide low resistance conductive paths. Thin package-side redistribution wiring interconnects 414 may be used to provide shielding from electromagnetic interference (EMI). An in-process interposer structure may be formed over the carrier substrate 300 within each die area.

The pattern of the package-side redistribution wiring interconnects 414 in the uppermost level of the package-side redistribution structure 410 may include at least one microbump region 501 including a respective array of microbumps 416. The microbumps 416 are a subset of the package-side redistribution wiring interconnects 414 that are arranged in an array configuration. The array of microbumps 416 may be provided as an array of copper pillars having a lateral dimension in a range from 10 microns to 25 microns and having a height in a range from 30 microns to 100 microns above a topmost surface of the package-side redistribution dielectric layers 412. The array of microbumps 416 may have a pitch in a range from 20 microns to 50 microns.

The top surfaces of the array of microbumps 416 may, or may not, be coplanar with the topmost surfaces of the package-side redistribution wiring interconnects 414. Each array of microbumps 416 may have a mirror image pattern of the pattern of microbumps to be provided on a respective silicon substrate interposer to be subsequently attached thereto.

Optionally, the pattern of the package-side redistribution wiring interconnects 414 in the uppermost level of the package-side redistribution structure 410 may include at least one interconnect-free region 601. In such an embodiment, the size of each interconnect-free region 601 may be at least the size of an integrated passive device to be subsequently disposed thereupon. The exemplary structure illustrated in FIG. 1 includes an in-process interposer structure, i.e., an intermediate structure during manufacturing that is subsequently modified into an interposer structure.

Figure 2A:
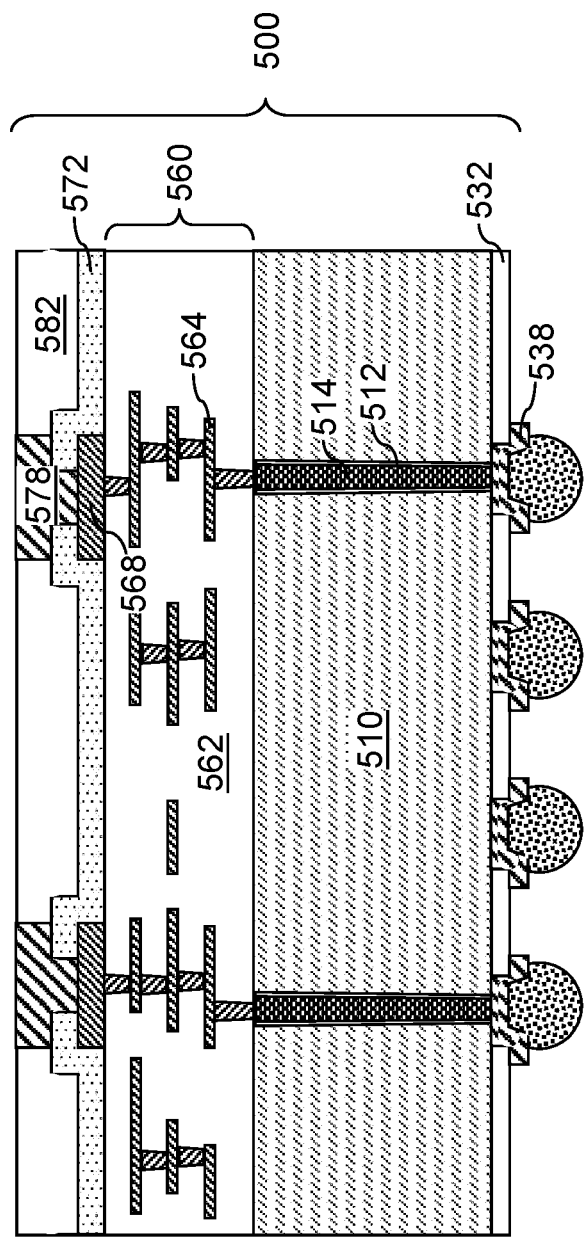
FIG. 2A is a vertical cross-sectional view of a silicon substrate interposer according to an embodiment of the present disclosure.

Referring to FIG. 2A, a silicon substrate interposer 500 according to an embodiment of the present disclosure is illustrated. The silicon substrate interposer 500 is an interposer structure that includes a silicon substrate 510 and electrically conductive structures that vertically extend through the silicon substrate, i.e., between a front-side surface of the silicon substrate 510 and a backside surface of the silicon substrate 510. Such electrically conductive structures include through-substrate via structures 514. The through-substrate via structures 514 may be initially formed as via structures within the silicon substrate 510 with a vertical dimension less than the thickness of the silicon substrate 510. Subsequently, the backside of the silicon substrate 510 may be removed such that the thickness of the silicon substrate 510 after thinning is less than the thickness of the through-substrate via structures 514, thereby providing the "through-substrate" configuration for the through-substrate via structure 514.

The silicon substrate 510 as initially provided may be a portion of a commercially available silicon wafer having a diameter of 150 mm, 200 mm, 300 mm, or 450 mm, and having a thickness in a range from 675 microns to 825 microns. In other words, the silicon substrate 510 in a silicon substrate interposer 500 may be a small portion of a commercially available silicon wafer, and the portion of the silicon wafer that is incorporated into the silicon substrate interposer 500 may be a small portion of the silicon wafer that is located within a single die area of the silicon wafer. Typically, the die area of the silicon wafer (i.e., the area of a single silicon substrate interposer 500) may be rectangular, and the length of each side may be in a range from 1 mm to 20 mm, such as from 2 mm to 10 mm, although lesser and greater lengths may also be used. The silicon wafer including the silicon substrate 510 (i.e., a portion to be incorporated into a silicon substrate interposer 500 upon dicing) may include electrical dopants (such as p-type dopants or n-type dopants) at an atomic concentration less than $1.0 \times 10^{14}/cm^3$ in order to provide low electrical conductivity and to minimize eddy current that may be induced by inductive coupling with high frequency electrical signals from, to, or between semiconductor dies or redistribution wiring interconnects to be subsequently placed in proximity.

The silicon wafer may include into a two-dimensional array (such as a rectangular array) of die areas. Each die area may correspond to the area of a silicon substrate interposer to be subsequently formed. An array of deep trenches having a depth greater than 20 microns may be formed within each die area of the silicon wafer. For example, a hard mask layer (such as a silicon nitride layer and/or a borosilicate glass layer) may be formed on a front-side surface of the silicon wafer, and a photoresist layer may be applied over the hard mask layer. The photoresist layer may be lithographically patterned to form an array of openings therethrough, and the pattern of the openings may be transferred into the hard mask layer. An anisotropic etch that uses the hard mask (and optionally the patterned photoresist layer) as an etch mask may be performed to form the deep trenches that vertically extend from the front-side surface of the silicon wafer toward the backside of the silicon wafer. The photoresist layer may be consumed during the anisotropic etch process, and the hard mask layer may be subsequently removed, for example, using a wet etch process. An array of openings, which are herein referred to as deep trenches, vertically extend from the front-side surface of the silicon wafer toward the backside surface of the silicon wafer.

The depth of the deep trenches may be in a range from 20 microns to 300 microns, such as from 50 microns to 150 microns, although lesser and greater depths may also be used. The maximum lateral dimension of each deep trench (such as a diameter) may be in a range from 3 microns to 30 microns, such as from 6 microns to 15 microns, although lesser and greater maximum lateral dimensions may also be used. Generally, the maximum lateral dimension for the deep trenches is selected to be large enough to provide deep etching into the silicon substrate 510, and is selected to be small enough to provide filling of the deep trenches with a combination of a through-substrate insulating spacer 512 and a through-substrate via (TSV) structure 514. The deep trenches may be formed in rows (i.e., one-dimensional arrays) with a one-dimensional periodicity, or may be formed as a two-dimensional array, which may be a periodic two-dimensional array (such as a rectangular array or a hexagonal array). The center-to-center distance between neighboring pairs of deep trenches may be in a range from 6 microns to 60 microns.

An insulating material may be conformally deposited into the array of openings and over the front-side surface of the silicon substrate 510 to form through-substrate insulating spacers 512. The insulating material of the through-substrate insulating spacer 512 may include silicon oxide (such as TEOS oxide) and/or silicon nitride. The thickness of the through-substrate insulating spacer 512 may be in a range from 1% to 30%, such as from 2% to 15%, of the maximum lateral dimension of each opening in the silicon substrate 510. For example, the through-substrate insulating spacer 512 may have a thickness in a range from 100 nm to 1,000 nm, although lesser and greater thicknesses may also be used.

At least one conductive material (such as a metallic material and/or a heavily-doped semiconductor material) may be deposited in remaining volumes of the deep trenches. For example, the at least one conductive material may include a metallic nitride liner having a thickness in a range from 30 nm to 120 nm and a metallic fill material that includes an elemental metal or an intermetallic alloy material. In an illustrative example, the metallic nitride liner may include TiN, TaN, WN, or a combination thereof, and the metallic fill material may include W, Mo, Co, Ru, or any other transition metal or an alloy thereof. Excess portions of the at least one conductive material may be removed from above the top surface of the silicon wafer (and thus, from above the top surface of the silicon substrate 510) by a planarization process such as a recess etch process or a chemical mechanical planarization process. Remaining portions of the at least one conductive material that fill the deep trenches constitute through-substrate via (TSV) structures 514. Generally, an array of TSV structures 514 may be formed by depositing at least one conductive material in the array of openings, i.e., deep trenches. Each of the TSV structures 514 may be laterally surrounded by a respective through-substrate insulating spacer 512.

An interconnect-level structure 560 including interconnect-level dielectric layers 562 and metal interconnect structures 564 may be formed on the front-side surface of the silicon wafer (which include a two-dimensional array of silicon substrates 510 corresponding to portions of the silicon wafer located within a respective die area). The interconnect-level dielectric layers 562 includes a respective dielectric material layer such as silicon oxide, organosilicate glass, silicon nitride, or any other dielectric material that may be used as interconnect-level insulating layers. The thickness of each interconnect-level dielectric layers 562 may be significantly thinner than the thicknesses of the package-side redistribution dielectric layers 412, thereby enabling higher wiring density, i.e., more electrical connections per unit volume. For example, the thickness of each interconnect-level dielectric layer 562 may be in a range from 100 nm to 1,000 nm, such as from 150 nm to 600 nm, although lesser and greater thicknesses may also be used.

The metal interconnect structures 564 include metal lines and metal via structures. The height of each metal interconnect structure 564 may be significantly less than the height of the package-side redistribution wiring interconnects 414, thereby enabling a higher wiring density. For example, the thickness of each metal line and the thickness of each metal via may be in a range from 100 nm to 1,000 nm, such as from 150 nm to 600 nm, although lesser and greater thicknesses may also be used. The minimum width of metal interconnect structures 564 depends on the lithographic capability of tools used to pattern the metal interconnect structures 564 of the level. For example, if deep ultraviolet (DUV) lithography tools are used to generate patterns for the metal interconnect structures 564, the minimum width for the metal interconnect structures 564 may be in a range from 20 nm to 100 nm. The metal interconnect structures 564 may be formed using standard processing methods for back-end-of-line (BEOL) processing sequences. The metal interconnect structures 564 may include copper, aluminum, tungsten, molybdenum, ruthenium, or other transition metals that may be formed as patterned structures. Other suitable materials may be within the contemplated scope of disclosure.

The total number of metal line levels in the interconnect-level structure 560 may be in a range from 2 to 12, such as from 3 to 6, although lesser and greater number of metal line levels may also be used. Metal pad structures 568 may be formed at the topmost level of the interconnect-level structure 560. A passivation dielectric layer 572 such as a silicon nitride layer may be deposited over the metal pad structures 568. The thickness of the passivation dielectric layer 572 may be in a range from 30 nm to 100 nm. Metal bonding structures 578 may be formed on each metal pad structure 568. The metal bonding structures 578 may be configured for C4 (controlled collapse chip connection) bonding, or may be configured for C2 bonding. In embodiments in which the metal bonding structures 578 are configured for C4 bonding, the metal bonding structures 578 may include copper pads having a thickness in a range from 5 microns to 30 microns and having a pitch in a range from 40 microns to 100 microns. In embodiments in which the metal bonding structures 578 are configured for C2 bonding, the metal bonding structures 578 may include copper pillars having a diameter in a range from 10 microns to 30 microns and having a pitch in a range from 20 microns to 60 microns. In such an embodiment, the copper pillar may be subsequently capped with a solder material to provide C2 bonding.

Subsequently, a temporary carrier substrate (not shown) may be attached to the metal bonding structures 578 and the optional pad-level dielectric layer 582. A temporary adhesive layer (not shown) may be used to attach the temporary carrier substrate to the surfaces of the metal bonding structures 578 and the optional pad-level dielectric layer 582. The temporary carrier substrate may have the same size as the silicon wafer.

The backside of the silicon wafer may be thinned until bottom surfaces of the TSV structures 514 are physically exposed. The thinning of the silicon wafer may be effected, for example, by grinding, polishing, an isotropic etch process, an anisotropic etch process, or a combination thereof. For example, a combination of a grinding process, an isotropic etch process, and a polishing process may be used to thin the backside of the silicon wafer. The thickness of the silicon wafer after thinning may be in a range from 20 microns to 150 microns, such as from 50 microns to 100 microns. The thickness of the silicon wafer after thinning is thin enough to physically expose backside surfaces (i.e., bottom surfaces) of the TSV structures 514, and is thick enough to provide sufficient mechanical strength to each silicon substrate 510 upon dicing the semiconductor wafer.

At least one dielectric material such as silicon nitride and/or silicon oxide may be deposited over the backside surface of the silicon wafer and over the physically exposed end surfaces of the TSV structures 514 to form a backside insulating layer 532. The thickness of the backside insulating layer 532 may be in a range from 100 nm to 1,000 nm, such as from 200 nm to 500 nm, although lesser and greater thicknesses may also be used. Openings are formed through the backside insulating layer 532, for example, by applying and lithographically patterning a photoresist layer, and transferring the pattern of the openings in the photoresist layer through the backside insulating layer 532 using an anisotropic etch process. A bottom surface of each TSV structure 514 may be physically exposed. The photoresist layer may be subsequently removed, for example, by ashing. At least one conductive material may be deposited on the physically exposed bottom surfaces of the TSV structures 514, and may be patterned to form backside bonding pads 538.

The backside bonding pads 538 may have a mirror image pattern of the pattern of the array of microbumps 416 provided in the in-process interposer structure of FIG. 1. In one embodiment, the backside bonding pads 538 may be provided as an array of microbumps, i.e., copper pillars configured for application of solder caps thereupon. In such an embodiment, the backside bonding pads 538 may include copper pillars having a diameter in a range from 10 microns to 30 microns and having a pitch in a range from 20 microns to 60 microns. The height of the copper pillar may be in a range from 20 microns to 60 microns.

The temporary carrier substrate may be detached from the assembly of the semiconductor wafer, the TSV structures 514 and the through-substrate insulating spacers 512, the interconnect-level structure 560, the passivation dielectric layer 572, the metal bonding structures 578, the optional pad-level dielectric layer 582, the backside insulating layer 532, the backside bonding pads 538 by deactivating the temporary adhesive layer. Depending on the debonding mechanism of the temporary adhesive layer, an ultraviolet radiation process or a thermal anneal process may be used to debond the temporary adhesive layer. The temporary carrier substrate may be peeled off, and a suitable clean process may be performed.

Subsequently, the assembly may be diced along dicing channels. Each diced portion of the assembly includes a silicon substrate interposer 500. The total thickness of the silicon substrate interposer 500 may be in a range from 100 microns to 300 microns, such as from 120 microns to 200 microns, although lesser and greater thicknesses may also be used. In one embodiment, a silicon substrate interposer 500 may have a rectangular horizontal cross-sectional shape, and the length of each side may be in a range from 1 mm to 20 mm, such as from 2 mm to 10 mm, although lesser and greater lengths may also be used.

Generally, each silicon substrate interposer 500 may be provided by forming through-silicon via (TSV) structures 514 in a silicon substrate 510, by forming metal interconnect structures 564 embedded in interconnect-level dielectric layers 562 on a front-side of the silicon substrate 510, by thinning a backside of the silicon substrate 510 to physically expose backside surfaces of the TSV structures 514, and by dicing the silicon substrate 510 and the interconnect-level dielectric layers 562 into a plurality of silicon substrate interposers 500.

The silicon substrate interposer 500 may provide a high-density array of vertical signal paths. In an illustrative example, a 3 mm×3 mm area may accommodate a 60×60 rectangular array of TSV structures 514 having a pitch of 50 microns, which may be connected to a 60×60 rectangular array of die-side microbumps comprising metal bonding structures 578 and to a 60×60 rectangular array of substrate-side microbumps comprising backside bonding pads 538. Thus, a high-density vertical wiring structure may be provided within the silicon substrate interposer 500.

Further, the silicon substrate interposer 500 may provide a high-density lateral signal path structure. In an illustrative example, a pair of 1.5 mm×3 mm areas may accommodate a pair of 30×60 rectangular array of die-side microbumps comprising two rectangular arrays of metal bonding structures 578. 1,800 lateral signal paths may be formed within the interconnect-level structure 560 through interconnections selected as a subset of the metal interconnect structures 564. The subset of the metal interconnect structures 564 may be electrically isolated from another subset of the metal interconnect structures 564 that is electrically connected to the TSV structures 514.

Generally, the silicon substrate interposer 500 is suitable for providing high-density vertical wiring and high-density lateral wiring, and may provide an equivalent of 2-20 levels of interconnect wiring and a single level of package-side redistribution wiring interconnects 414. At least one silicon substrate interposer 500 may be subsequently incorporated into an interposer structure of embodiments of the present disclosure.

Figure 2B:
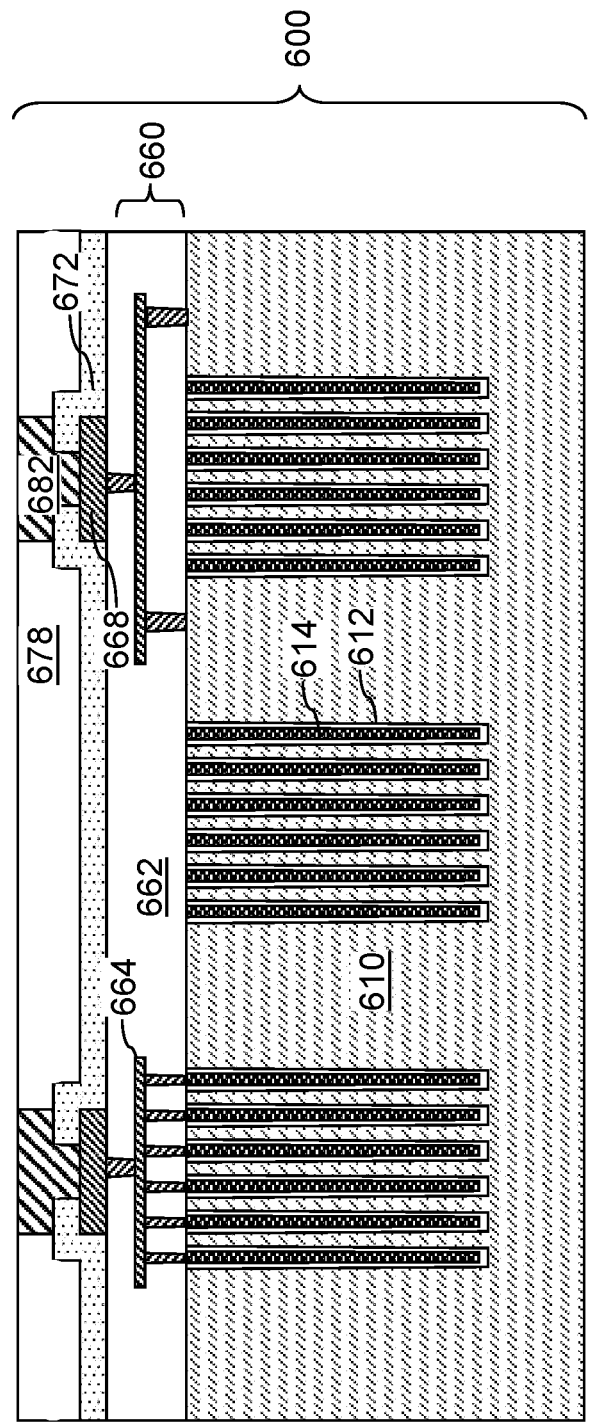
FIG. 2B is a vertical cross-sectional view of an integrated passive device according to an embodiment of the present disclosure.

Referring to FIG. 2B, an integrated passive device 600 according to an embodiment of the present disclosure. Generally, the integrated passive device 600 may include any passive device that may be formed within, or on, a substrate such as the silicon substrate 610, a dielectric substrate, or a metallic substrate. For example, the integrated passive device 600 may include at least one capacitor, at least one inductor, at least one diode, at least one antenna, or any other passive electrical component known in the art. In the illustrated example, the integrated passive device 600 may include capacitors that use the silicon substrate 610 as a first electrode, dielectric material layers 612 located on surfaces of deep trenches as node dielectrics, and metallic fill material portions 614 in the deep trenches as a second electrode. The configuration of FIG. 2B is only illustrative, and any other configurations for capacitors or for any other integrated passive device may be used. The silicon substrate 610 may be provided as a portion of a silicon wafer located within a single die area. In other words, a two-dimensional array of dies including a respective passive device may be formed, and may be subsequently diced to provide a silicon substrate 610.

An interconnect-level structure 660 including interconnect-level dielectric layers 662 and metal interconnect structures 664 may be formed on the front-side surface of the silicon wafer prior to dicing. The interconnect-level dielectric layers 662 includes a respective dielectric material layer such as silicon oxide, organosilicate glass, silicon nitride, or any other dielectric material that may be used as interconnect-level insulating layers. The metal interconnect structures 664 include metal lines and metal via structures. For example, the thickness of each metal line and the thickness of each metal via may be in a range from 100 nm to 1,000 nm, such as from 150 nm to 600 nm, although lesser and greater thicknesses may also be used. The metal interconnect structures 664 may include copper, aluminum, tungsten, molybdenum, ruthenium, or other transition metals that may be formed as patterned structures. Other suitable materials may be within the contemplated scope of disclosure.

The total number of metal line levels in the interconnect-level structure 660 may be in a range from 1 to 8, such as from 2 to 4, although lesser and greater number of metal line levels may also be used. Metal pad structures 668 may be formed at the topmost level of the interconnect-level structure 660. A passivation dielectric layer 672 such as a silicon nitride layer may be deposited over the metal pad structures 668. The thickness of the passivation dielectric layer 672 may be in a range from 30 nm to 100 nm. Metal bonding structures 682 may be formed on each metal pad structure 668. The metal bonding structures 678 may be configured for C4 (controlled collapse chip connection) bonding, or may be configured for C2 bonding. The semiconductor wafer with the interconnect-level structure 660 may be subsequently diced to provide a plurality of integrated passive devices 600. At least one of the integrated passive devices 600 may be optionally subsequently incorporated into an interposer structure of embodiments of the present disclosure.

Figure 3A:
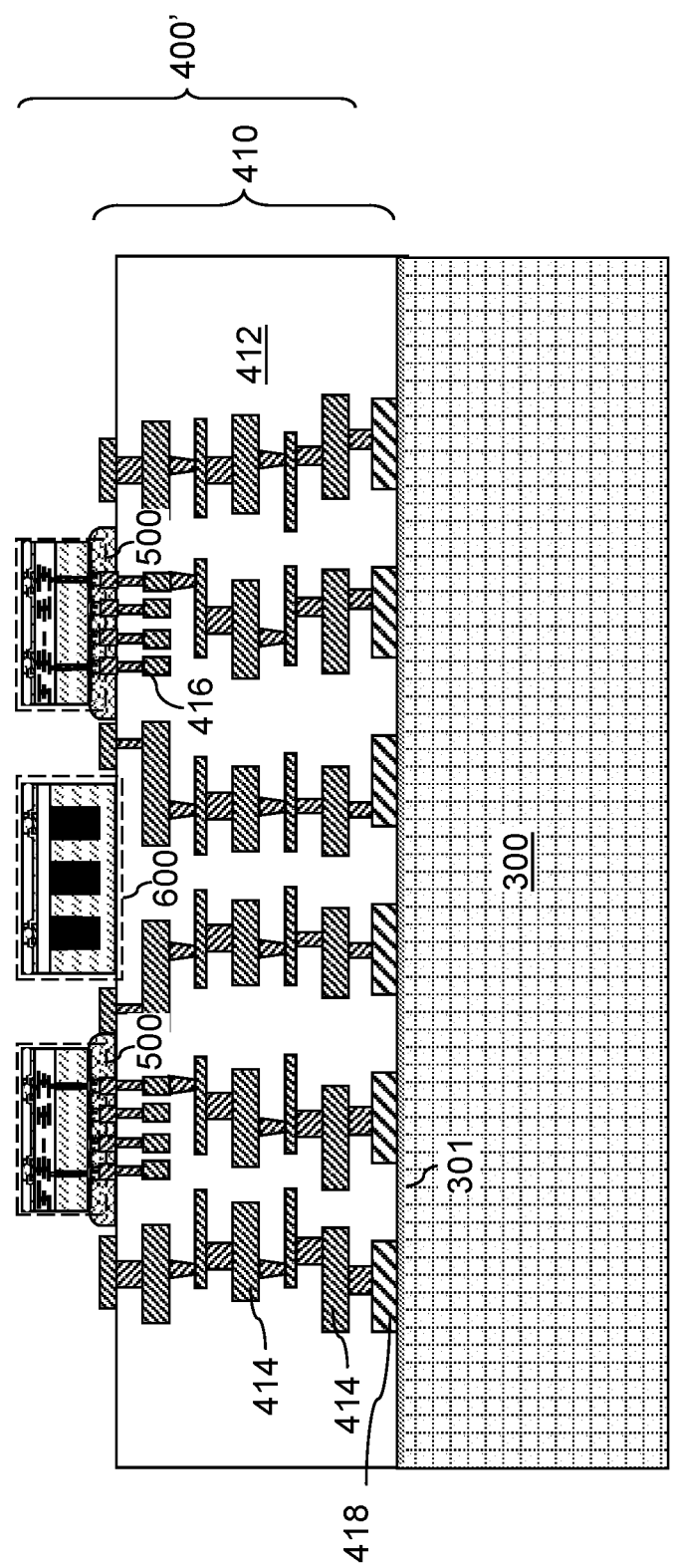
FIG. 3A is a vertical cross-sectional view of an in-process interposer structure including the package-side redistribution structure, silicon substrate interposers, and an integrated passive device according to an embodiment of the present disclosure.
Figure 3B:
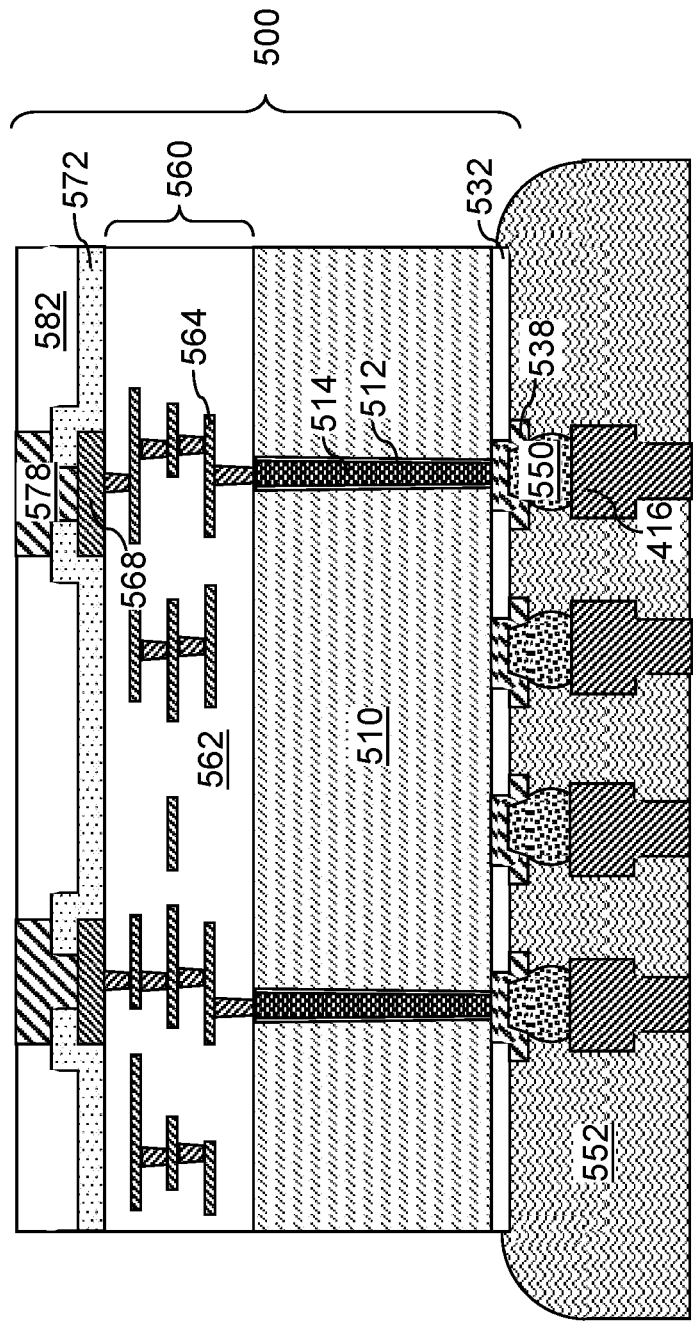
FIG. 3B is a magnified view of a region of the in-process interposer structure of FIG. 3A.

Referring to FIGS. 3A and 3B, at least one silicon substrate interposer 500 provided at the processing steps of FIG. 2A and at least one integrated passive device 600 provided at the processing steps of FIG. 2B may be attached to the in-process interposer structure provided at the processing steps of FIG. 1. As discussed above, a two-dimensional array of silicon substrate interposers 500 may be provided on the carrier substrate 300 such that each silicon substrate interposer 500 is located within a respective die area. Each silicon substrate interposer 500 may be attached to the in-process interposer structure within a respective microbump region 501. Specifically, each silicon substrate interposer 500 may be attached to package-side redistribution wiring interconnects 414 within the package-side redistribution structure 410 through a respective array of microbumps 416. Each integrated passive device 600 may be attached to the in-process interposer structure within a respective interconnect-free region 601. Thus, the at least one silicon substrate interposer 500 and the at least one integrated passive device 600 may be incorporated into the in-process interposer structure 400'.

For example, solder material portions 550 in the shape of solder caps may be applied to an array of microbumps 416 of the package-side redistribution structures 410, and an array of backside bonding pads 538 in a silicon substrate interposer 500 may be disposed on the solder material portions 550 after alignment. After each array of backside bonding pads 538 for each silicon substrate interposer 500 is disposed on a respective array of solder material portions 550, a reflow anneal process is performed to reflow the solder material portions 550 to provide C2 bonding. Each solder material portion 550 is attached to a pair of a microbump 416 and a backside bonding pad 538. An underfill material portion 552 may be formed around each array of solder material portions 550 after each silicon substrate interposer 500 is bonded to the microbumps 416. For example, an underfill material may be applied and fills the volume between each silicon substrate interposer 500 and the package-side redistribution structures 410 using the capillary underfill method, the molded underfill method, or the printed underfill method.

Each integrated passive device 600 may be attached to the in-process interposer structure using a permanent adhesive material layer such as a conductive paste. In one embodiment, the thickness of each integrated passive device 600 may be selected such that the top surfaces of the at least one integrated passive device 600 and the at least one silicon substrate interposer 500 are positioned within a same horizontal plane.

Figure 4:
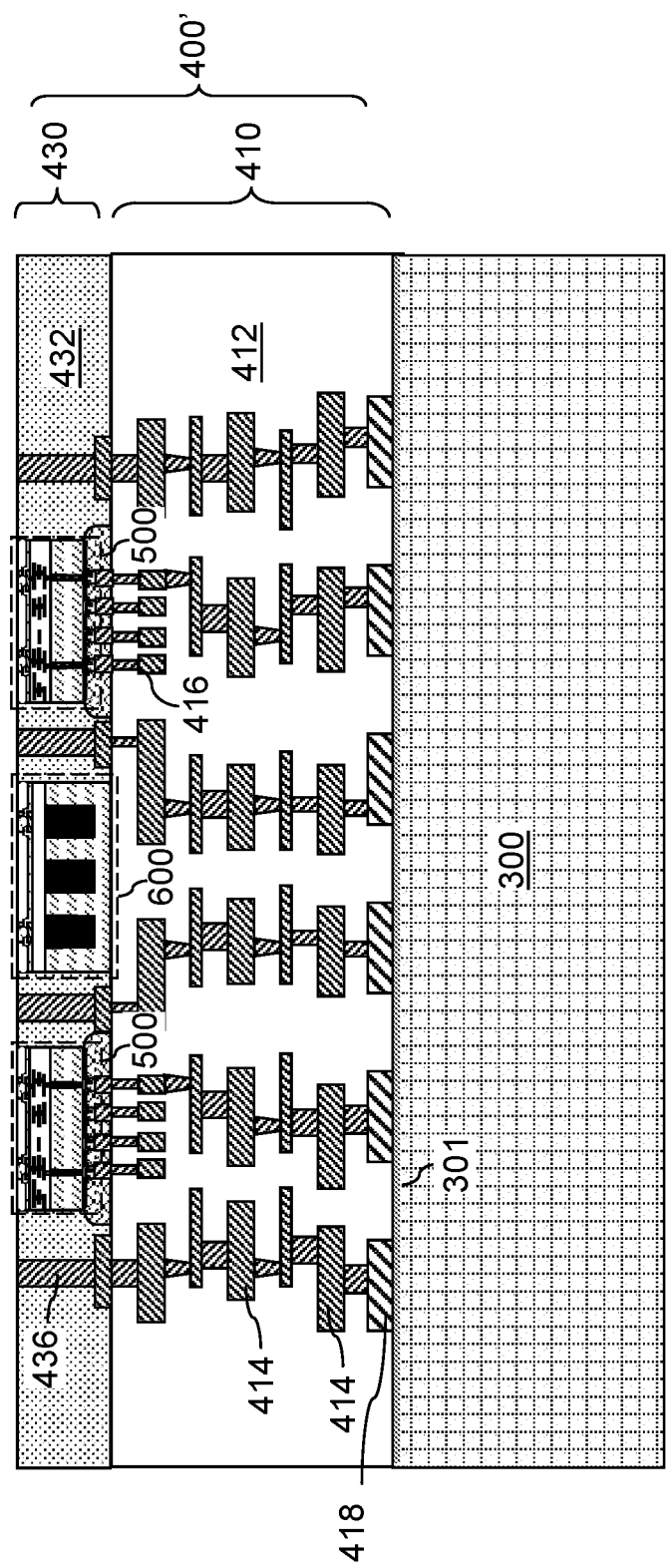
FIG. 4 is a vertical cross-sectional view of an in-process interposer structure after formation of an interposer core assembly according to an embodiment of the present disclosure.

Referring to FIG. 4, an epoxy molding compound (EMC) is applied over the package-side redistribution structures 410 around the silicon substrate interposers 500 and the integrated passive devices 600. The EMC includes an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the adhesive layer 301 if the adhesive layer 301 includes a thermally debonding material. For example, the curing temperature of the EMC may be in a range from 125° C. to 150° C.

The EMC may be cured at a curing temperature to form an EMC matrix that laterally encloses each of the silicon substrate interposers 500 and the integrated passive devices 600. The EMC matrix includes a plurality of epoxy molding compound (EMC) interposer frames 432 that are laterally adjoined to one another. Each EMC interposer frame 432 is located within a respective die area, and laterally surrounds and embeds a respective set of at least one silicon substrate interposer 500 and optionally at least one integrated passive device 600, if present. Excess portions of the EMC may be removed from above the horizontal plane including the top surfaces of the silicon substrate interposers 500 and the integrated passive devices 600 by a planarization process, which may use chemical mechanical planarization.

A photoresist layer (not shown) may be applied over the EMC matrix, and may be lithographically patterned to form openings within areas of the package-side redistribution wiring interconnects 414 that are located at a topmost level of package-side redistribution structure 410. The package-side redistribution wiring interconnects 414 located at the topmost level may be in contact with the EMC matrix. An anisotropic etch process may be performed to form via cavities through the EMC matrix underneath the openings in the photoresist layer. A top surface of a package-side redistribution wiring interconnects 414 may be physically exposed at the bottom of each via cavity that extends through the EMC matrix. The photoresist layer may be subsequently removed, for example, by ashing.

At least one conductive material such as a combination of a metallic nitride liner material (e.g., TiN, TaN, WN, or a combination thereof) and a metallic fill material (such as W, Mo, Co, Ru, Cu, or any other transition metal) may be deposited in the via cavities in the EMC matrix (which includes a two-dimensional array of EMC interposer frames 432). Excess portions of the at least one conductive material may be removed from above the horizontal plane including the top surface of the EMC matrix by performing a planarization process such as a chemical mechanical planarization process. Remaining portions of the at least one conductive material that fills the via cavities constitute through-molding-compound via (TMCV) structures 436, which are conductive via structures that vertically extend through a respective EMC interposer frame 432. Upon formation of die-side redistribution structure in a subsequent processing step, the TMCV structures 436 electrically connect a respective pair of a die-side redistribution wiring interconnect within the die-side redistribution structure and a package-side redistribution wiring interconnect 414 within the package-side redistribution structure 410.

Each combination of at least one silicon substrate interposers 500, at least one integrated passive devices 600 (if present), an EMC interposer frame 432, and TMCV structures 436 located within a die area constitutes an interposer core assembly 430. Each of the at least one silicon substrate interposer 500 comprises a respective set of backside bonding pads 538 that are bonded to the package-side redistribution structure 410 through a respective array of microbumps 416. Each array of microbumps 416 may be laterally surrounded by a respective interposer underfill material portion 552 that contacts the package-side redistribution structure 410. The EMC interposer frame 432 laterally surrounds, and laterally encloses, each of the at least one silicon substrate interposer 500 within a respective die area. Each integrated passive device 600, if present, is embedded in the EMC interposer frame 432. In some embodiments, at least one of the integrated passive device 600 may be electrically connected to package-side redistribution wiring interconnects 414 within the package-side redistribution structure 410, for example, through C4 bonding or C2 bonding.

Figure 5:
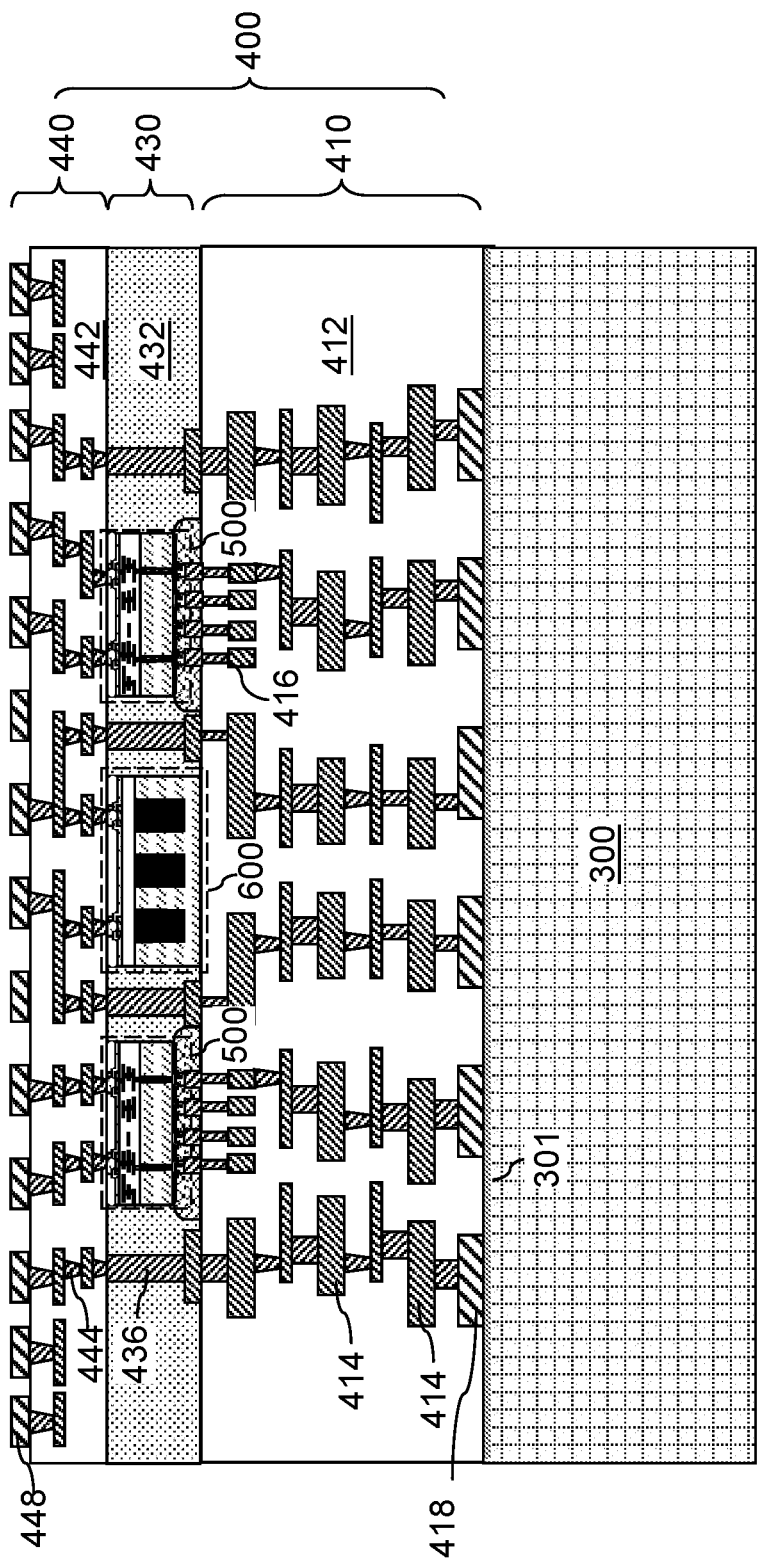
FIG. 5 is a vertical cross-sectional view of an interposer structure after formation of a die-side redistribution structure according to an embodiment of the present disclosure.

Referring to FIG. 5, die-side redistribution structures 440 may be formed over the carrier substrate 300. The die-side redistribution structures 440 are a subset of redistribution structures that are formed on the side to which semiconductor dies are to be subsequently attached with respect to the interposer core assembly 430. Specifically, a die-side redistribution structure 440 may be formed within each die area over the two-dimensional array of interposer core assemblies 430 (of which only one is illustrated in FIG. 5). Each die-side redistribution structure 440 may include die-side redistribution dielectric layers 442, die-side redistribution wiring interconnects 444, and die-side bonding pads 448.

The die-side redistribution dielectric layers 442 include a respective dielectric polymer material such as polyimide (PI), benzocyclobutene (BCB), or polybenzobisoxazole (PBO). Each die-side redistribution dielectric layer 442 may be formed by spin coating and drying of the respective dielectric polymer material. The thickness of each die-side redistribution dielectric layer 442 may be in a range from 2 microns to 40 microns, such as from 4 microns to 20 microns. Each die-side redistribution dielectric layer 442 may be patterned, for example, by applying and patterning a respective photoresist layer thereabove, and by transferring the pattern in the photoresist layer into the die-side redistribution dielectric layer 442 using an etch process such as an anisotropic etch process. The photoresist layer may be subsequently removed, for example, by ashing.

Each of the die-side redistribution wiring interconnects 444 and the die-side bonding pads may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have a thickness of at least 50 nm, and the copper seed layer may have a thickness in a range from 100 nm to 500 nm. The metallic fill material for the die-side redistribution wiring interconnects 444 may include copper, nickel, or copper and nickel.

The thickness of the metallic fill material that is deposited for each die-side redistribution wiring interconnect 444 may be in a range from 2 microns to 40 microns, such as from 4 microns to 20 microns, although lesser or greater thicknesses may also be used. The total number of levels of wiring in each die-side redistribution structure 440 (i.e., the levels of the die-side redistribution wiring interconnects 444) may be in a range from 1 to 12, such as from 2 to 8. The total height of the die-side redistribution structure 440 may be in a range from 30 microns to 300 microns, although lesser and greater heights may also be used.

In one embodiment, the thicknesses of the die-side redistribution dielectric layers 442 and the die-side redistribution wiring interconnects 444 may be selected such that die-side redistribution wiring interconnects 444 provided at different wiring levels have different thicknesses. Thick die-side redistribution wiring interconnects 444 may be used to provide low resistance conductive paths. Thin die-side redistribution wiring interconnects 444 may be used to provide shielding from electromagnetic interference (EMI).

The pattern of the die-side redistribution wiring interconnects 444 in the bottommost level of the die-side redistribution structure 440 may include via structures that contact a respective one of the metal bonding structures 578 of the silicon substrate interposers 500, metal bonding structures 678 of the integrated passive devices 600, and the TMCV structures 436.

The die-side bonding pads 448 may be formed on the topmost one of the die-side redistribution dielectric layers 442. For example, a copper seed layer may be deposited on the adhesive layer 301 by sputtering (i.e., physical vapor deposition). The thickness of the copper seed layer may be at least 50 nm. A photoresist layer (not shown) may be applied over the copper seed layer, and may be lithographically patterned to form openings within each dies in the pattern of an array of bonding pads. Copper may be electroplated within the openings in the photoresist layer. The thickness of the electroplated copper may be in a range from 5 microns to 50 microns, such as from 10 microns to 20 microns, although lesser and greater thicknesses may also be used.

The die-side bonding pads 448 may have horizontal cross-sectional shapes of rectangles, rounded rectangles, or circles. The photoresist layer may be removed by ashing, and horizontal portions of the copper seed layer between electroplated copper portions may be etched back, for example, using a wet etch process. Remaining discrete portions of copper comprise the die-side bonding pads 448, which are bonding pads that are subsequently used to attach solder material portions to be bonded to a respective semiconductor die.

Each combination of a package-side redistribution structure 410, an interposer core assembly 430, and a die-side redistribution structure 440 located within a die area constitutes an interposer structure 400. A first subset of the die-side redistribution wiring interconnects 444 within the die-side redistribution structure 440 includes segments of vertical signal paths that are connected to the TSV structures 514. A second subset of the die-side redistribution wiring interconnects 444 within the die-side redistribution structure 440 includes horizontally-extending portions of chip-to-chip signal paths that may be used to provide direct communication between at least two semiconductor dies to be subsequently attached to the interposer structure 400. The chip-to-chip signal paths may include a subset of the metal interconnect structures 564 within at least one silicon substrate interposer 500 in order to provide high areal wiring density in a plan view (i.e., in a view along a vertical direction). In such an embodiment, the at least two semiconductor dies may be electrically isolated from the package-side redistribution wiring interconnects 414 and from the TMCV structures 436 to reduce or eliminate cross-talk with vertically-propagating signals that pass through the TSV structures 514 or the TMCV structures 436. The TMCV structures 436 electrically connect a respective pair of a die-side redistribution wiring interconnect 444 within the die-side redistribution structure 440 and a package-side redistribution wiring interconnect 414 within the package-side redistribution structure 410.

Generally, an interposer structure 400 according to embodiments of the present disclosure may comprise, from one side to another, a package-side redistribution structure 410, an interposer core assembly 430, and a die-side redistribution structure 440. The interposer core assembly 430 comprises at least one silicon substrate interposer 500, an epoxy molding compound (EMC) interposer frame 432 embedding the at least one silicon substrate interposer 500, and optionally through-molding-compound via (TMCV) structures 436 that vertically extend through the EMC interposer frame 432. Each of the at least one silicon substrate interposer 500 comprises a respective silicon substrate 510, a respective set of through-silicon via (TSV) structures 514 vertically extending through the respective silicon substrate 510, a respective set of interconnect-level dielectric layers 562 embedding a respective set of metal interconnect structures 564, a respective set of metal bonding structures 578 that are electrically connected to a subset of die-side redistribution wiring interconnects 444; and a respective set of backside bonding pads 538 that are electrically connected to package-side redistribution wiring interconnects 414 through a respective array of microbumps 416. In one embodiment, at least one set of metal interconnect structures 564 within the at least one silicon substrate interposer 500 is configured to provide electrically conductive paths that connect a respective pair of the die-side redistribution wiring interconnects 444 and are electrically isolated from the package-side redistribution wiring interconnects 414.

In one embodiment, interfaces between the TMCV structures 436 and the die-side redistribution wiring interconnects 444 may be located within a horizontal plane including interfaces between each set of metal bonding structures (578, 678) and the die-side redistribution wiring interconnects 444. In one embodiment, each set of metal bonding structures (578, 678) directly contacts a respective subset of die-side redistribution wiring interconnects 444 within the die-side redistribution structure 440.

At least one integrated passive device 600, if present, is embedded in the EMC interposer frame 432. The at least one integrated passive device 600 may be electrically connected to die-side redistribution wiring interconnects 444 within the die-side redistribution structure 440, or to package-side redistribution wiring interconnects 414 within the package-side redistribution structure 410.

In one embodiment, the electrical connections among the at least one silicon substrate interposer 500, the optional integrated passive devices 600, and the die-side redistribution wiring interconnects 444 can be tested employing the die-side bonding pads 448 at this processing step.

Figure 6A:
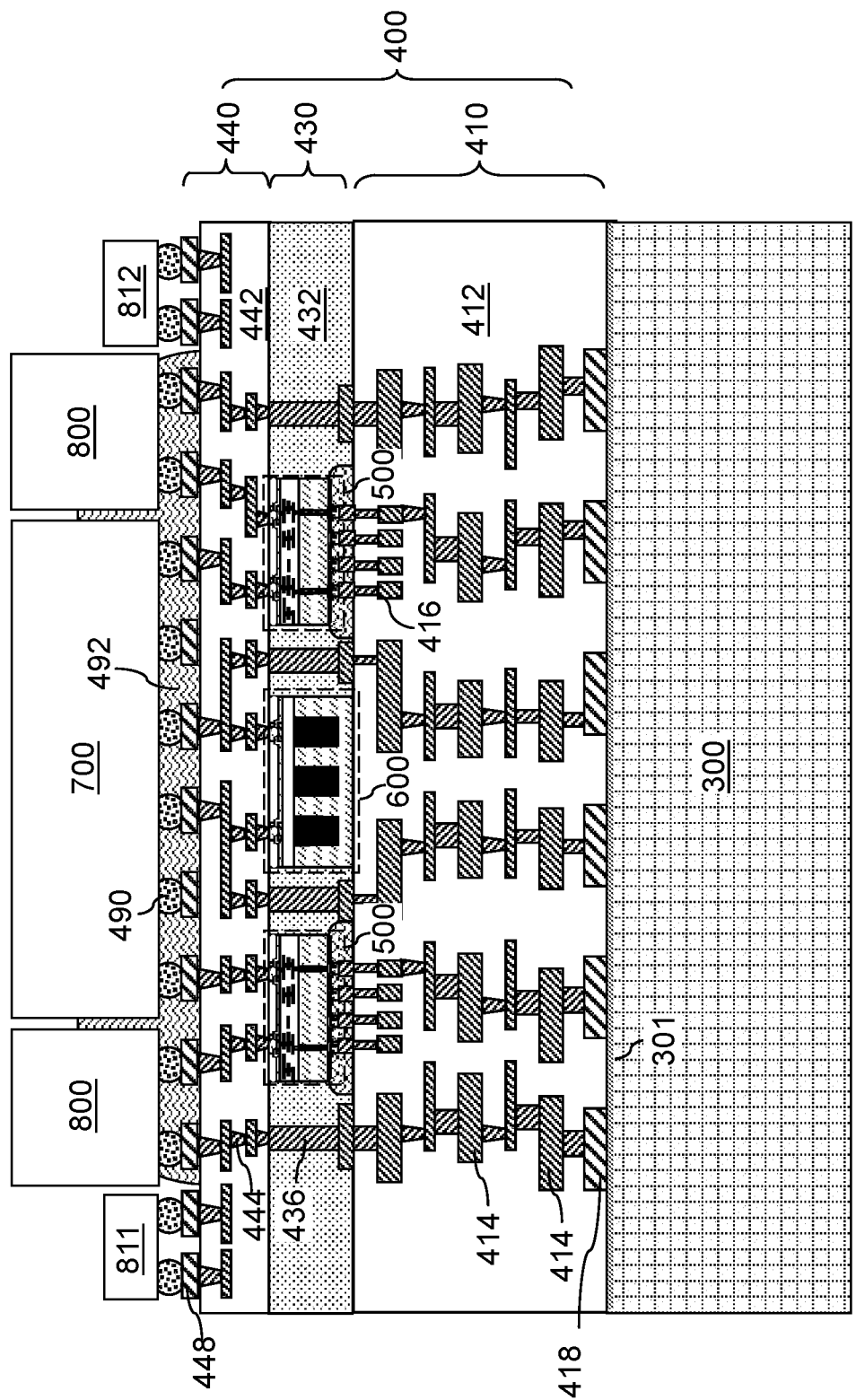
FIG. 6A is a vertical cross-sectional view of a first exemplary structure after attaching semiconductor dies to the interposer structure of FIG. 5 according to an embodiment of the present disclosure.
Figure 6B:
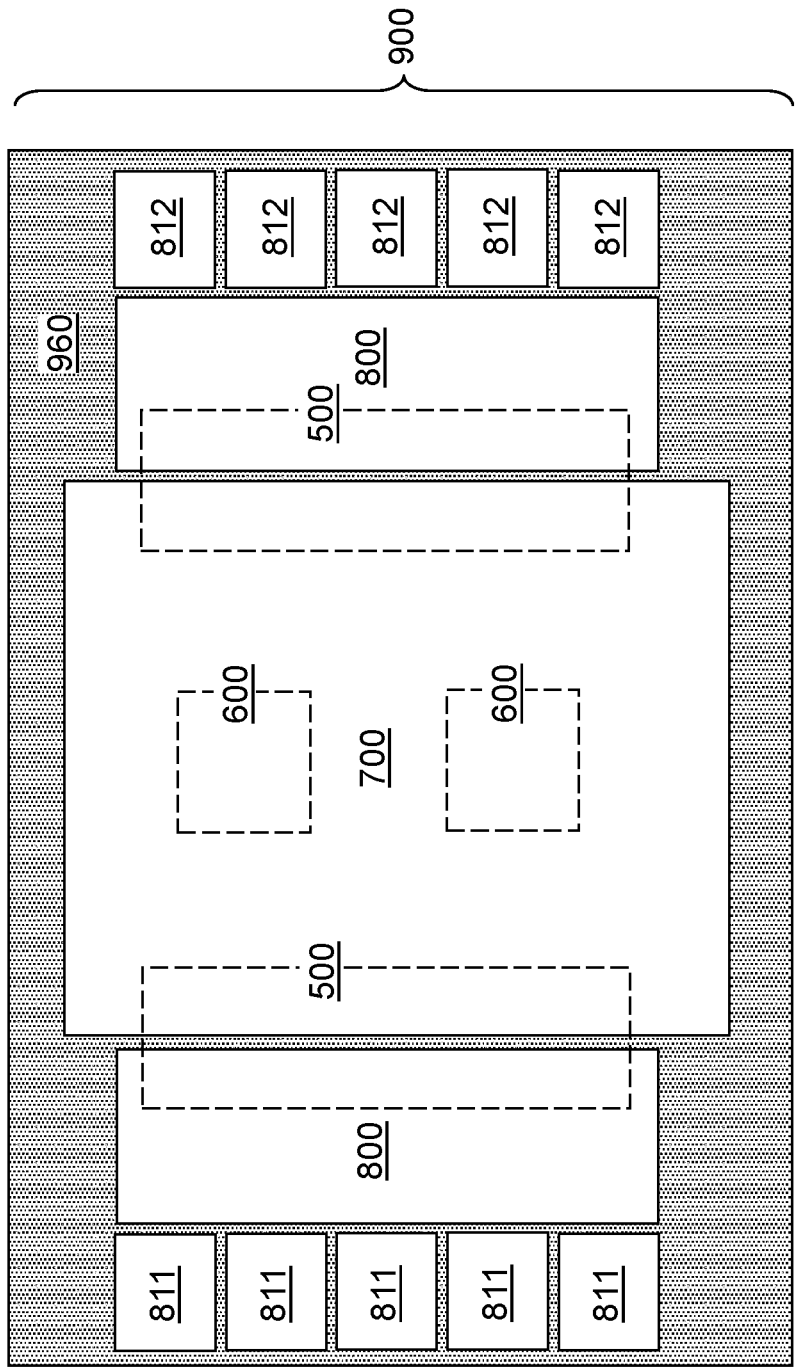
FIG. 6B is a top-down view of the first exemplary structure of FIG. 6A.

Referring to FIGS. 6A and 6B, a first exemplary structure according to an embodiment of the present disclosure is illustrated, which may be derived from the exemplary structure of FIG. 5 by attaching a plurality of semiconductor dies (700, 800) to each interposer structure 400 within the two-dimensional array of interposer structures 400 provided on a carrier substrate 300. At least two semiconductor dies (700, 800) are attached to the die-side redistribution structure 440 of each interposer structure 400.

The plurality of semiconductor dies (700, 800) may include at least two semiconductor dies (700, 800) configured to directly communicate with each other. In one embodiment, the plurality of semiconductor dies (700, 800) may include at least one system-on-chip (SoC) die and at least another die configured to directly communicate with the SoC die, which may include at least one memory die or a graphic processing unit die. For example, the plurality of semiconductor dies (700, 800) may include a first semiconductor die 700 that is an SoC die and at least one second semiconductor die 800 that is a high bandwidth memory (HBM) die. In one embodiment, the first semiconductor die 700 may include an SoC die, and a plurality of HBM dies configured to communicate with the SoC die may be used as second semiconductor dies 800. At least one set of metal interconnect structures 564 within the at least one silicon substrate interposer 500 may be configured to provide electrically conductive paths that connect the SoC die and the HBM die, and may be electrically isolated from package-side redistribution wiring interconnects 414 within the package-side redistribution structure 410.

An HBM die includes a vertical stack of static random access memory dies and provides high bandwidth as defined under JEDEC standards, i.e., standards defined by The JEDEC Solid State Technology Association. An HBM die may include a vertical stack of static random access memory (SRAM) dies that are interconnected to one another through arrays of microbumps thereamongst. One of the SRAM dies, such as a bottommost SRAM die or a topmost SRAM die, may include a logic circuit for providing controlling each of the SRAM dies, and the bottommost SRAM die may include an array of bonding pads. An HBM underfill material portion may fill the gaps between neighboring pairs of the SRAM dies around a respective array of solder caps adjoined to a pair of microbump arrays. Optionally, an epoxy molding material enclosure frame may be used to laterally surround, and to provide structural stability to, the vertical stack of the SRAM dies.

The plurality of semiconductor dies (700, 800) is attached to the die-side redistribution structure 440 through at least two arrays of solder material portions 490. Each array of solder material portions 490 may include an array of C4 solder balls attached to a respective pair of C4 bonding pads, or may include an array of C2 solder cap portions attached to a respective pair of C2 bonding structures such as arrays of copper pillars.

The first semiconductor die 700 and the at least one second semiconductor die 800 may be arranged such that each second semiconductor die 800 is positioned adjacent to a side of the first semiconductor die 700 in a manner that an underlying silicon substrate interposer 500 has an areal overlap with both the first semiconductor die 700 and the second semiconductor die 800. In one embodiment, each of the at least one silicon substrate interposer 500 may have an areal overlap with a respective pair of semiconductor dies (700, 800) within at least two semiconductor dies (700, 800) in a see-through plan view (i.e., a plan view in which overlying structures and underlying structures are shown simultaneously). Each of the at least one silicon substrate interposer 500 provides lateral electrically conductive paths between the respective pair of semiconductor dies (700, 800).

The chip-to-chip electrical connections between each neighboring pair of the first semiconductor die 700 and a second semiconductor die 800 may be provided by a first array of solder connections (which may be C2 connections C4 connections) between the first semiconductor die 700 and a portion of the die-side redistribution structure 440 having an areal overlap with the first semiconductor die 700, a first set of die-side redistribution wiring interconnects 444 providing electrical connection between the first array of solder connections and an underlying silicon substrate interposer 500, metal interconnect structures 564 within the silicon substrate interposer 500, and a second set of die-side redistribution wiring interconnects 444 providing electrical connection between the silicon substrate interposer 500 and a second array of solder connections (which may be C2 connections C4 connections) between the second semiconductor die 800 and a portion of the die-side redistribution structure 440 having an areal overlap with the second semiconductor die 800.

At least one underfill material portion 492 may laterally surround the at least two arrays of solder material portions 490. The plurality of semiconductor dies (700, 800) may be embedded in the EMC matrix 910M such that the top surfaces of the plurality of semiconductor dies (700, 800) are positioned within a same horizontal plane. Generally, a subset of die-side redistribution wiring interconnects 444 within the die-side redistribution structure 440 provides chip-to-chip signal paths between the at least two semiconductor dies (700, 800). The chip-to-chip signal paths between the at least two semiconductor dies (700, 800) may be electrically isolated from the package-side redistribution wiring interconnects 414 and from the TMCV structures 436.

In one embodiment, at least one passive device component (811, 812) may be optionally attached to the die-side redistribution structure 440 through additional solder material portions 490. The at least one passive device component (811, 812) may include any passive device such as a capacitor, an inductor, an antenna, etc.

Figure 7:
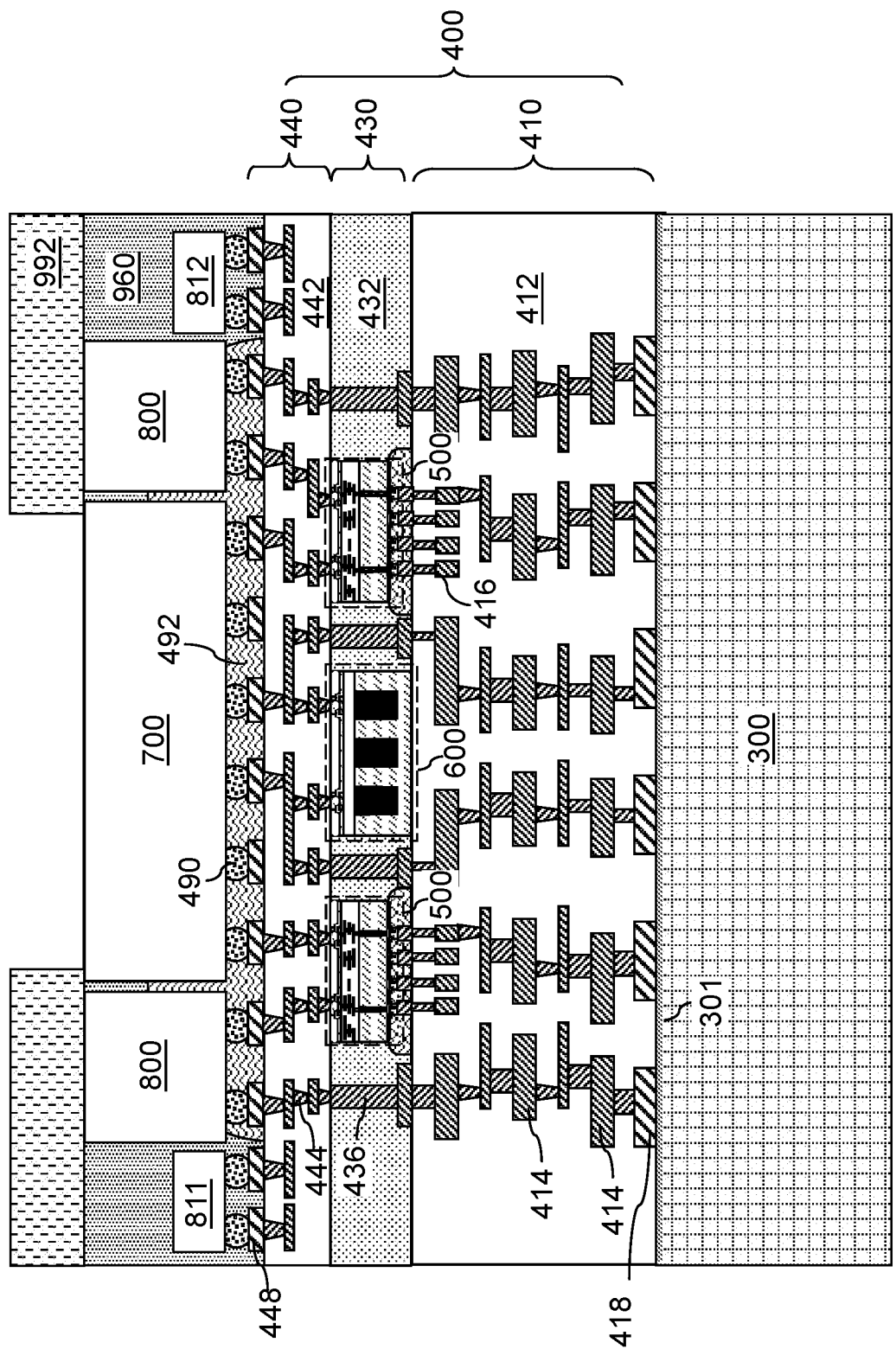
FIG. 7 is a vertical cross-sectional view of the first exemplary structure after formation of an epoxy molding compound (EMC) multi-die frame and after attaching a ring structure according to an embodiment of the present disclosure.

Referring to FIG. 7, another epoxy molding compound (EMC) may be applied to the gaps between the semiconductor dies (700, 800). The EMC applied at this processing step may use any of the EMC materials that may be used to form the EMC interposer frames 432 as described above. The EMC is cured at a curing temperature to form an EMC matrix that laterally encloses each of the semiconductor dies (700, 800) and extends over the entire area of the carrier substrate 300. The EMC matrix includes a plurality of epoxy molding compound (EMC) multi-die frames 960 that are laterally adjoined to one another. Each EMC multi-die frame 960 is located within a respective die area, and laterally surrounds and embeds a respective set of at least one semiconductor die (700, 800) that is bonded to an underlying die-side redistribution structure 440. At least one passive device component (811, 812) may be attached to the die-side redistribution structure 440 within each die area, and may be embedded in a respective EMC multi-die frame 960.

Excess portions of the EMC may be removed from above the horizontal plane including the top surfaces of the semiconductor dies (700, 800) by a planarization process, which may use chemical mechanical planarization. Generally, each EMC die frame 960 laterally surrounds, and embeds, at least one semiconductor die (700, 800). Optionally, a stabilization structure 992, such as a cap structure or a ring structure, may be attached to the assembly of the EMC matrix to reduce deformation of the assembly of the two-dimensional array of interposer structures 400, the EMC matrix, and the semiconductor dies (700, 800) embedded therein during subsequent processing steps.

The stabilization structure 992 may counteract the tendency for the EMC die frame 960 to crack under stress around the periphery of the semiconductor dies (700, 800) in case the area of the EMC die frame 960 becomes relatively large. For example, the area of the alternative embodiment of the bonded assembly in a top-down view may be greater than 1 cm$^2$, and may be greater than 4 cm$^2$. A stabilization structure 992, which may be embodied as a cap structure or a ring structure, may be attached to each EMC die frame 960 to reduce deformation of the assembly during subsequent processing steps and/or during usage of the assembly. Specifically, the stabilization structure 992 may be attached to the top surface of the EMC die frame 960, and may extend inward over the periphery of the assembly of the semiconductor dies (700, 800). In one embodiment, the stabilization structure 992 may include a metal ring structure.

Figure 8:
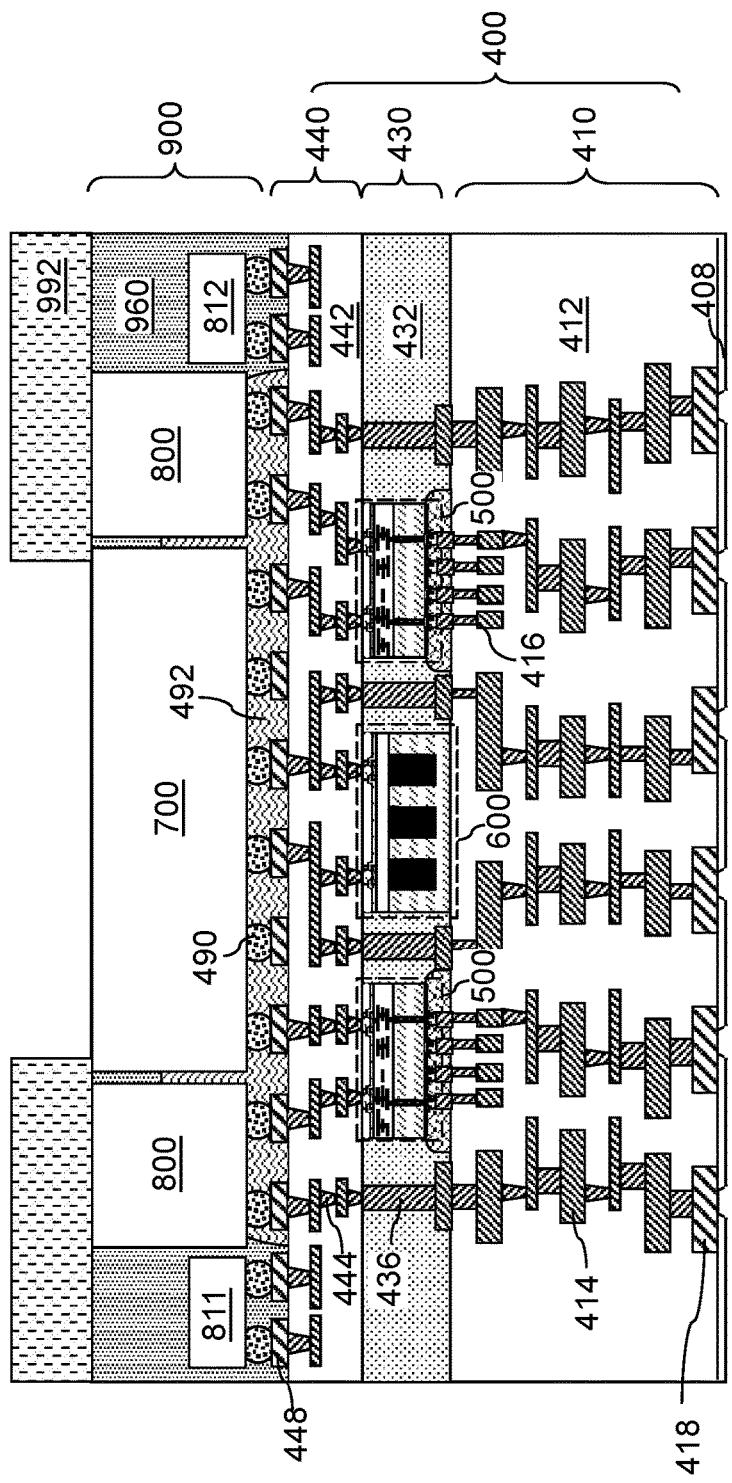
FIG. 8 is a vertical cross-sectional view of the first exemplary structure after removing the carrier substrate and after exposing package-side bonding pads according to an embodiment of the present disclosure.

Referring to FIG. 8, the adhesive layer 301 may be decomposed by ultraviolet radiation or by a thermal anneal at a debonding temperature. In embodiments in which the carrier substrate 300 includes an optically transparent material and the adhesive layer 301 includes an LTHC layer, the adhesive layer may be decomposed by irradiating ultraviolet light through the transparent carrier substrate. The LTHC layer may be absorb the ultraviolet radiation and generate heat, which decomposes the material of the LTHC layer and cause the transparent carrier substrate to be detached from the assembly (i.e., a two-dimensional array) of the interposer structures 400. In embodiments in which the adhesive layer 301 includes a thermally decomposing adhesive material, a thermal anneal process at a debonding temperature may be performed to detach the assembly of the interposer structures 400 from the carrier substrate 300. A suitable clean process may be performed to remove remaining portions of the adhesive layer 301.

Optionally, a package-side dielectric cap layer 408 (such as a silicon oxide layer) may be deposited over the package-side bonding pads 418. The package-side dielectric cap layer 408 may be patterned to form an array of openings so that a surface of a respective one of the package-side bonding pads 418 is physically exposed in each opening through the package-side dielectric cap layer.

The assembly including the two-dimensional array of interposer structures 400, the EMC matrix including a two-dimensional array of EMC multi-die frames 960, and the semiconductor dies (700, 800) embedded therein may be subsequently diced along dicing channels by performing a dicing process. Each diced unit includes a combination of an interposer structure 400, a fan-out wafer level package (FOWLP) 900 including a plurality of semiconductor dies (700, 800) and an EMC multi-die frame 960, and solder material portions 490 and at least one underfill material potion 492 that are embedded within the EMC multi-die frame 960. Optionally, at least one passive device component (811, 812) may be embedded in the EMC multi-die frame 960.

The two-dimensional array of interposer structures 400 and the EMC matrix are diced using a same set of dicing channels in a single dicing process. As such, sidewalls of the EMC multi-die frame 960 are adjoined to, and are vertically coincident with, sidewalls of the interposer structure 400 within each assembly of an FOWLP 900 and an interposer structure 400.

Figure 9:
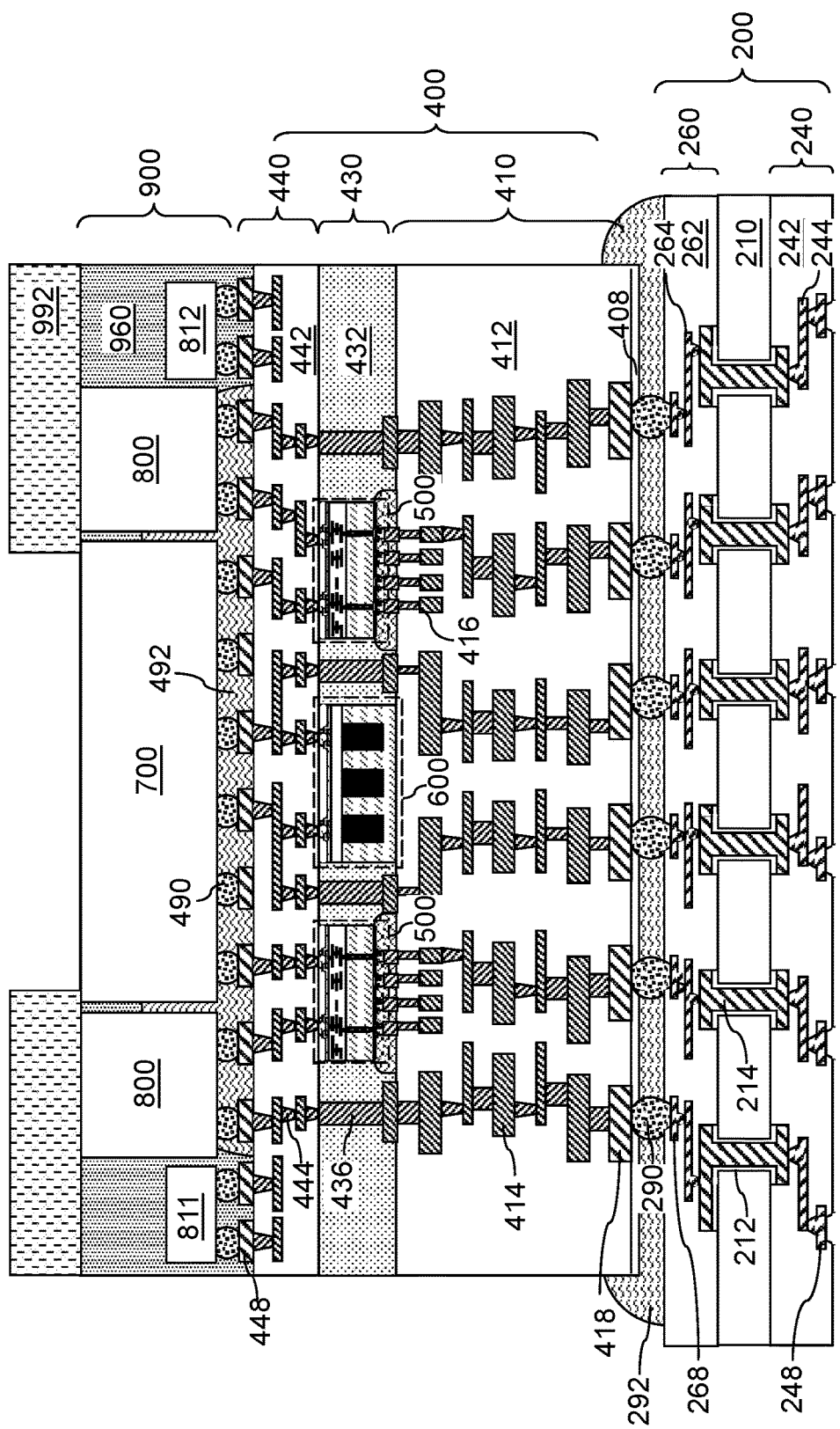
FIG. 9 is a vertical cross-sectional view of the first exemplary structure after bonding the interposer structure to a package substrate according to an embodiment of the present disclosure.

Referring to FIG. 9, a package substrate 200 may be provided. The package substrate 200 may be a cored package substrate including a core substrate 210, or a coreless package substrate that does not include a package core. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC 240 may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262. An array of board-side bonding pads 248 may be electrically connected to the board-side wiring interconnects 244, and may be configured to allow bonding through solder balls. An array of chip-side bonding pads 268 may be electrically connected to the chip-side wiring interconnects 264, and may be configured to allow bonding through C4 solder balls.

Interposer-to-package C4 solder balls 290 may be attached to the package-side bonding pads 418 of an assembly of an interposer structure 400 and an FOWLP 900. The interposer-to-package C4 solder balls 290 may be disposed on the array of the chip-side bonding pads 268 of the package substrate 200. A reflow process may be performed to reflow the interposer-to-package C4 solder balls 290, thereby inducing bonding between the interposer structure 400 and the package substrate 200. In one embodiment, the interposer-to-package C4 solder balls 290 may include C4 solder balls, and the assembly of the interposer structure 400 and the FOWLP 900 may be attached to the package substrate 200 using an array of C4 solder balls. A package-side underfill material portion 292 may be formed around the interposer-to-package C4 solder balls 290 by applying and shaping an underfill material.

Figure 10:
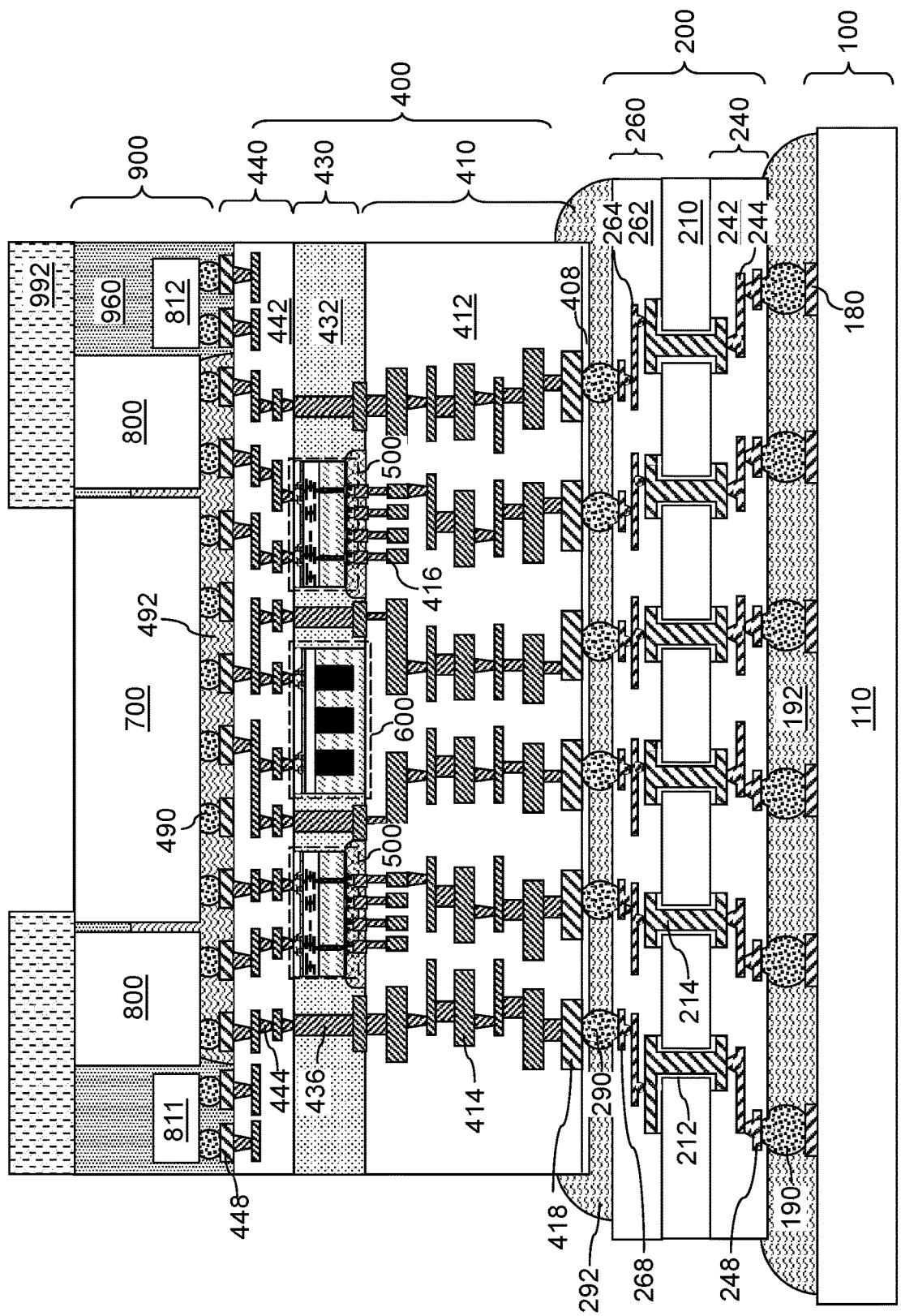
FIG. 10 is a vertical cross-sectional view of the first exemplary structure after bonding the package substrate to a printed circuit board (PCB) according to an embodiment of the present disclosure.

Referring to FIG. 10, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The package substrate 200 is attached to the PCB 100 through the array of solder joints 190.

Figure 11:
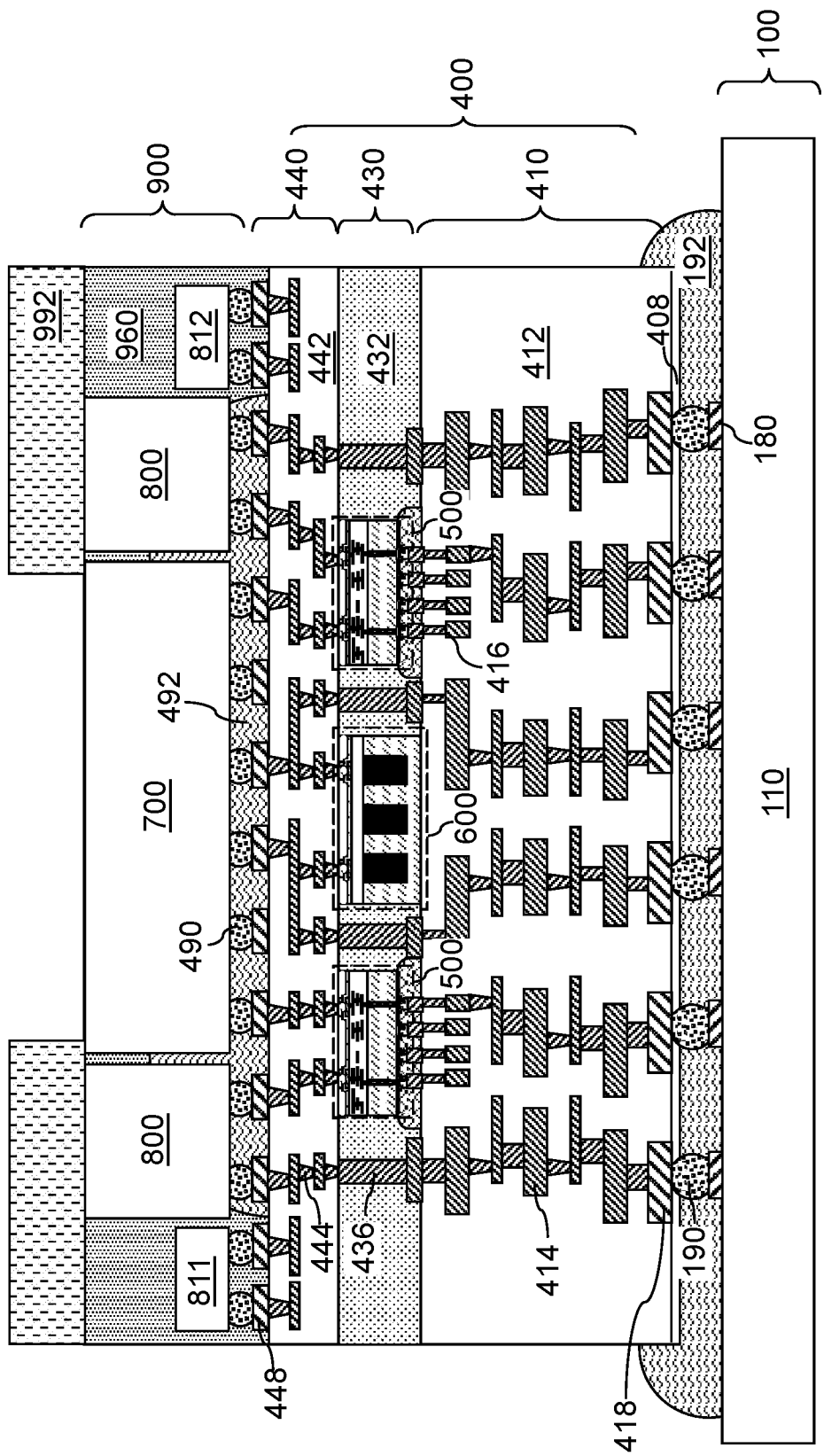
FIG. 11 is a vertical cross-sectional view of an alternative embodiment of the first exemplary structure after bonding the interposer structure to a printed circuit board (PCB) according to an embodiment of the present disclosure.

Referring to FIG. 11, an alternative embodiment of the first exemplary structure is illustrated. In this embodiment, an assembly of an interposer structure 400 and an FOWLP 900 may be directly bonded to a PCB 100 without using a package substrate therebetween.

Figure 12:
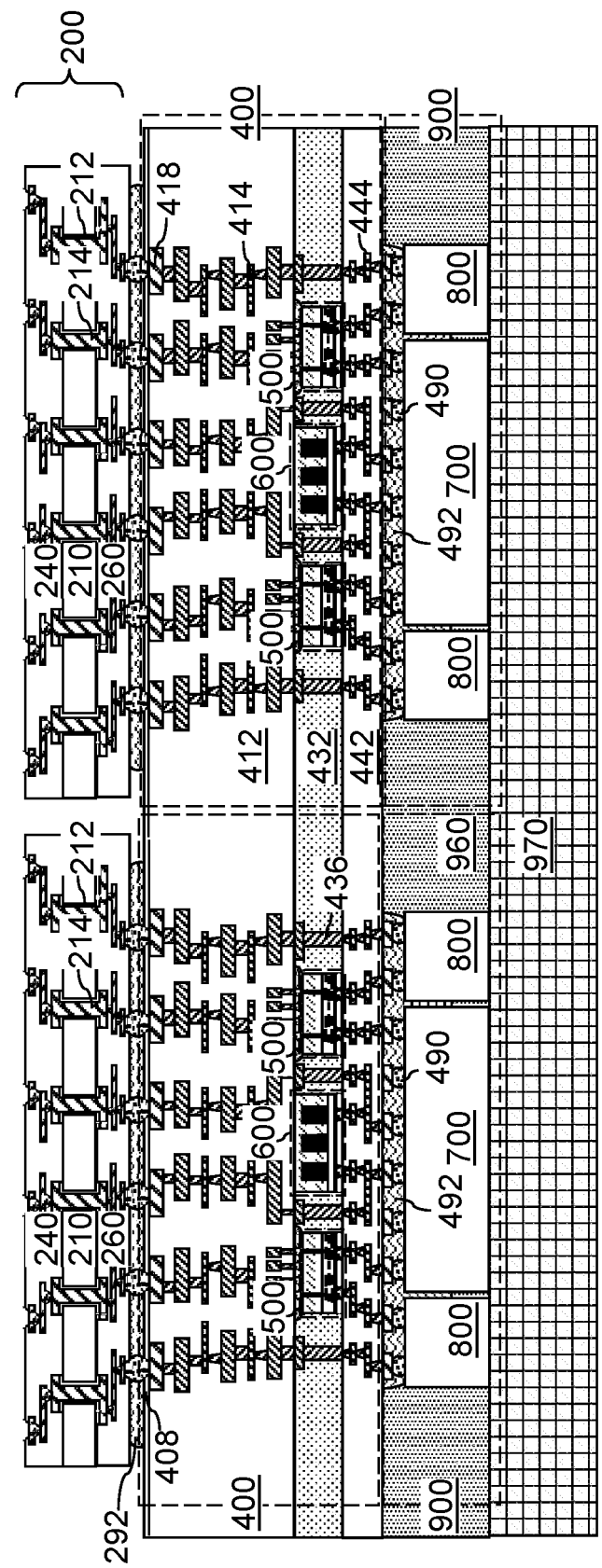
FIG. 12 is a vertical cross-sectional view of a second exemplary structure after attaching package substrates to interposer structures according to an embodiment of the present disclosure.

Referring to FIG. 12, a second exemplary structure according to an embodiment of the present disclosure is illustrated, which may be derived from the first exemplary structure of FIG. 7 by not attaching the stabilization structures 992. A temporary handle substrate 970 may be optionally attached to the EMC matrix including a two-dimensional array of EMC multi-die frames 960. A suitable temporary adhesive layer may be used to attach the temporary handle substrate 970 to the planar surface of the EMC matrix. The carrier substrate 300 may be subsequently removed in the same manner as in the processing steps of FIG. 8. A package-side dielectric cap layer 408 (such as a silicon oxide layer) may be deposited over the package-side bonding pads 418. The package-side dielectric cap layer 408 may be patterned to form an array of openings so that a surface of a respective one of the package-side bonding pads 418 is physically exposed in each opening through the package-side dielectric cap layer.

A two-dimensional array of package substrates 200 is attached to a two-dimensional array of interposer structures 400 using a respective array of interposer-to-package C4 solder balls 290. Package-side underfill material portions 292 may laterally surround a respective array of interposer-to-package C4 solder balls 290, and may contact a respective package substrate 200 and a respective interposer structure 400.

Figure 13:
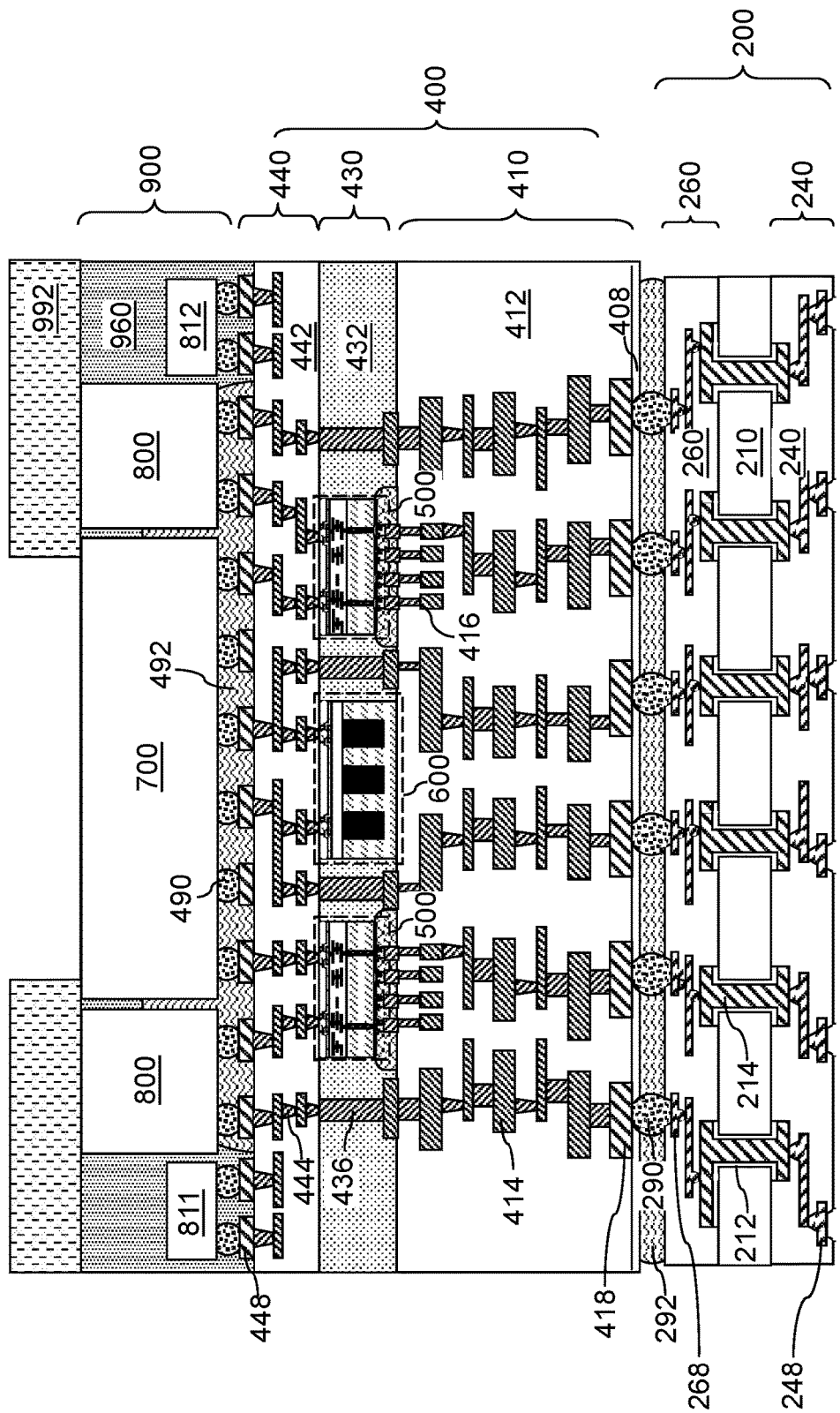
FIG. 13 is a vertical cross-sectional view of the second exemplary structure after dicing a two-dimensional array of interposer structures into interposer structures according to an embodiment of the present disclosure.

Referring to FIG. 13, the optional temporary handle substrate 970 may be detached from the assembly including the two-dimensional array of interposer structures 400, the EMC matrix including a two-dimensional array of EMC multi-die frames 960, and the semiconductor dies (700, 800) embedded therein. The assembly may be subsequently diced along dicing channels by performing a dicing process. Each diced unit includes a combination of an interposer structure 400, a fan-out wafer level package (FOWLP) 900 including a plurality of semiconductor dies (700, 800) and an EMC multi-die frame 960, and solder material portions 490 and at least one underfill material potion 492 that are embedded within the EMC multi-die frame 960. Optionally, at least one passive device component (811, 812) may be embedded in the EMC multi-die frame 960.

The two-dimensional array of interposer structures 400 and the EMC matrix are diced using a same set of dicing channels in a single dicing process. As such, sidewalls of the EMC multi-die frame 960 are adjoined to, and are vertically coincident with, sidewalls of the interposer structure 400 within each assembly of an FOWLP 900 and an interposer structure 400. A stabilization structure 992 may be attached to each FOWLP 900 to reduce warpage of the combination of the FOWLP 900 and an attached interposer structure 400.

Figure 14:
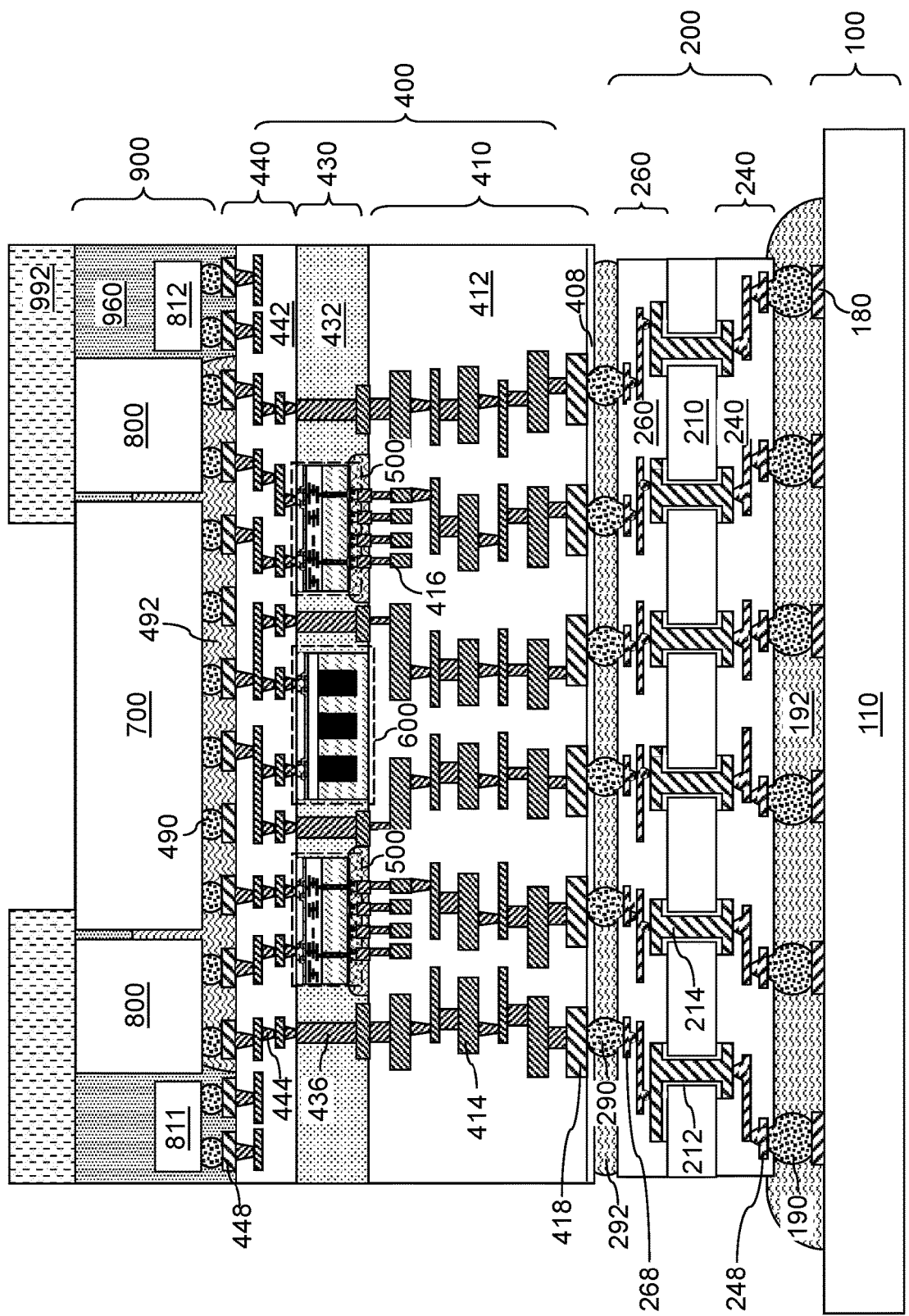
FIG. 14 is a vertical cross-sectional view of the second exemplary structure after attaching the package substrate to a printed circuit board (PCB) according to an embodiment of the present disclosure.

Referring to FIG. 14, the processing steps of FIG. 10 may be performed to attach a combination of an FOWLP 900, an interposer structure 400, and a package substrate 200 to a printed circuit board (PCB) 100.

Figure 15:
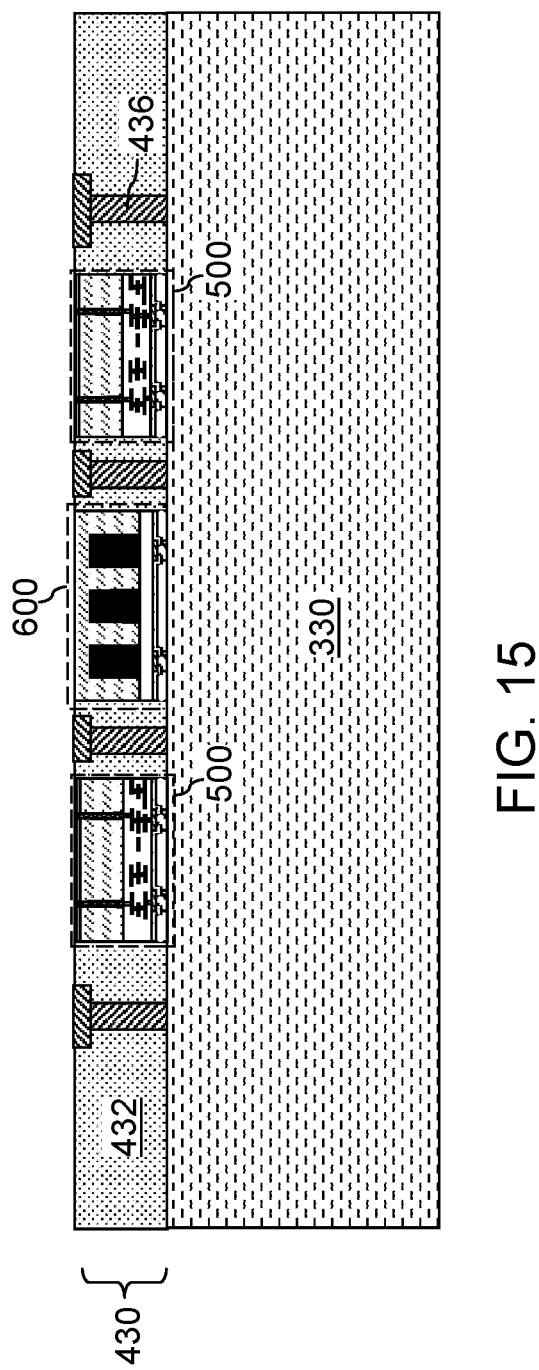
FIG. 15 is a vertical cross-sectional view of a third exemplary structure after formation of an interposer core assembly according to an embodiment of the present disclosure.

Referring to FIG. 15, a third exemplary structure according to an embodiment of the present disclosure is illustrated. The third exemplary structure may be formed by arranging at least one silicon substrate interposer 500 and at least one optional integrated passive device 600 within each die area over a top surface of a carrier substrate 330. An epoxy molding compound (EMC) is applied over the package-side redistribution structures 410 around the silicon substrate interposers 500 and the integrated passive devices 600. The processing steps of FIG. 4 may be employed to form an EMC matrix that includes a plurality of epoxy molding compound (EMC) interposer frames 432 that are laterally adjoined to one another. Each EMC interposer frame 432 may be located within a respective die area, and laterally surrounds and embeds a respective set of at least one silicon substrate interposer 500 and optionally at least one integrated passive device 600, if present. Excess portions of the EMC may be removed from above the horizontal plane including the top surfaces of the silicon substrate interposers 500 and the integrated passive devices 600 by a planarization process, which may use chemical mechanical planarization.

Through-molding-compound via (TMCV) structures 436 may be formed through each EMC interposer frame 432 by performing the processing steps of FIG. 4. Each combination of at least one silicon substrate interposers 500, at least one integrated passive devices 600 (if present), an EMC interposer frame 432, and TMCV structures 436 located within a die area constitutes an interposer core assembly 430.

Figure 16:
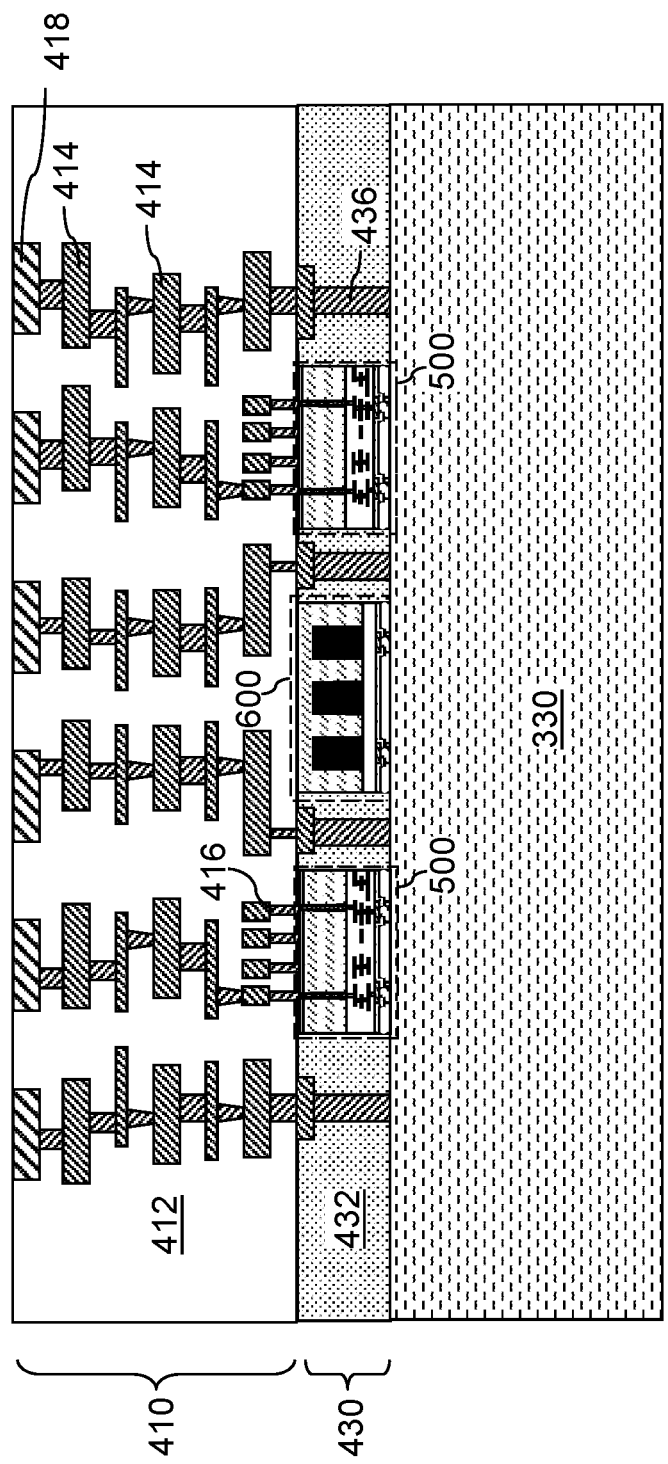
FIG. 16 is a vertical cross-sectional view of the third exemplary structure after formation of a package-side redistribution structure according to an embodiment of the present disclosure.

Referring to FIG. 16, the processing steps of FIG. 1 may be performed generally in reverse order and with necessary changes in the processing sequences to form a package-side redistribution structure 410. The at least one silicon substrate interposer 500 and the optional integrated passive devices 600 may be connected to package-side redistribution wiring interconnects 414 within the package-side redistribution structure 410. The electrical connections among the at least one silicon substrate interposer 500, the optional integrated passive devices 600, and the package-side redistribution wiring interconnects 414 may be tested employing the package-side bonding pads 418 at this processing step.

Figure 17:
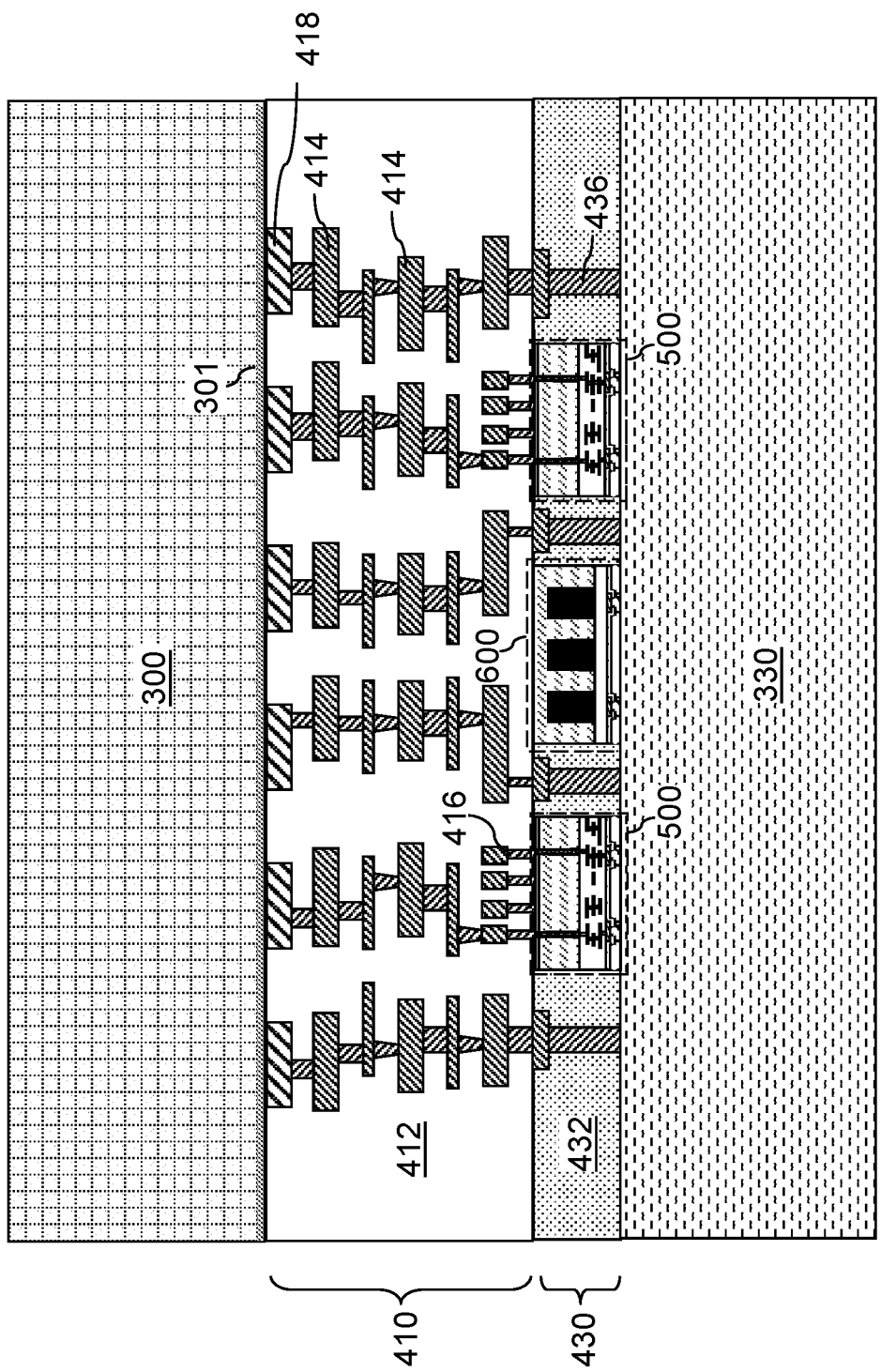
FIG. 17 is a vertical cross-sectional view of the third exemplary structure after attaching an additional carrier substrate according to an embodiment of the present disclosure.

Referring to FIG. 17, another carrier substrate 300 may be attached to the surfaces of the package-side bonding pads 418 employing an adhesive layer 301.

Figure 18:
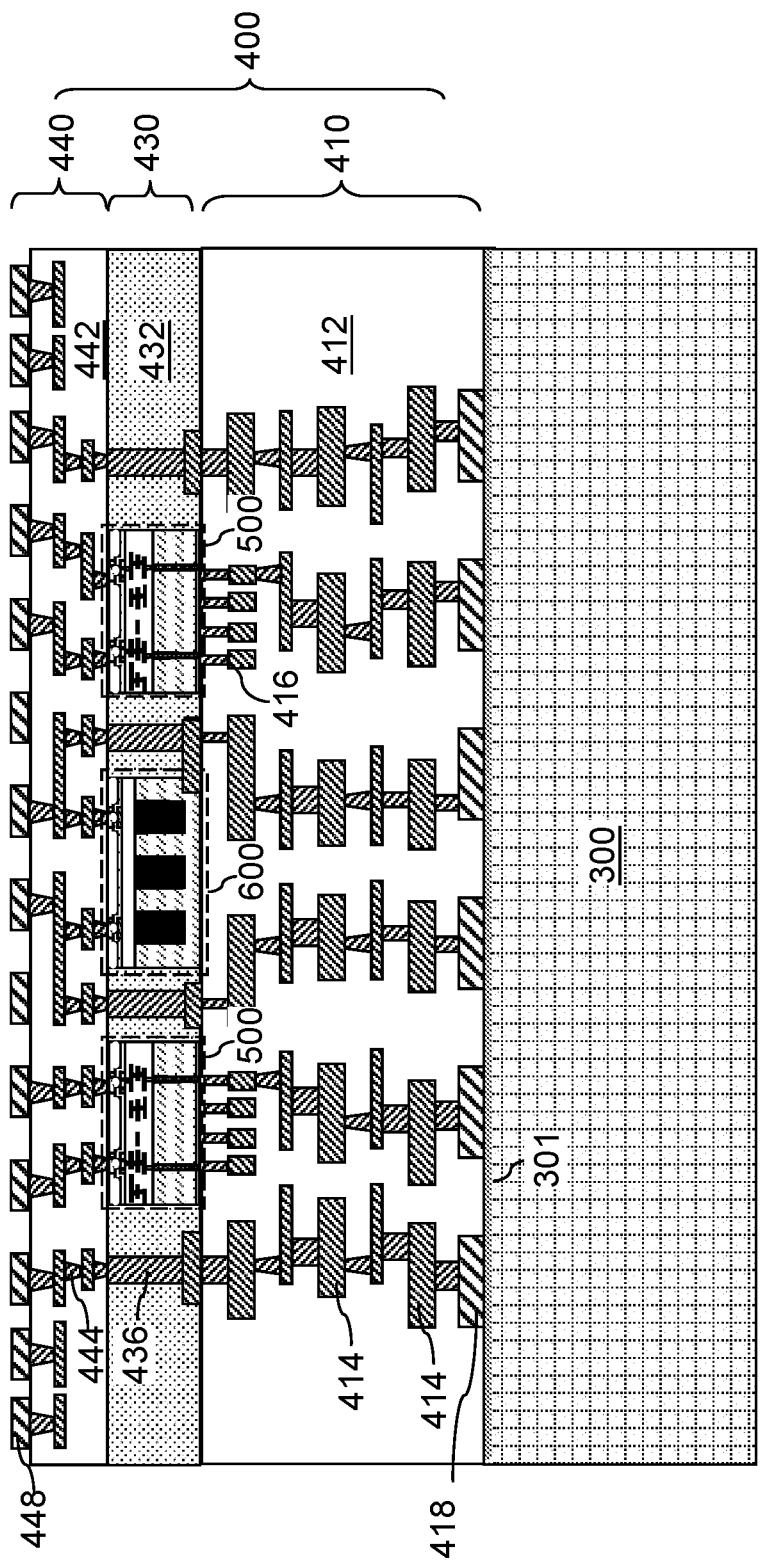
FIG. 18 is a vertical cross-sectional view of the third exemplary structure after removing a carrier substrate and after formation of die-side redistribution structure according to an embodiment of the present disclosure.

Referring to FIG. 18, the carrier substrate 330 may be detached. A suitable clean process may be performed. The processing steps of FIG. 5 may be performed to form a die-side redistribution structure 440. The electrical connections among the at least one silicon substrate interposer 500, the optional integrated passive devices 600, and the die-side redistribution wiring interconnects 444 may be tested by using the die-side bonding pads 448 at this processing step.

Subsequently, the processing steps of FIGS. 6A and 6B, 7, 8, 9, 10, 11, 12, 13, and/or 14 may be performed to provide the structure illustrated in FIG. 10, the structure illustrated in FIG. 11, or the structure illustrated in FIG. 14.

Figure 19:
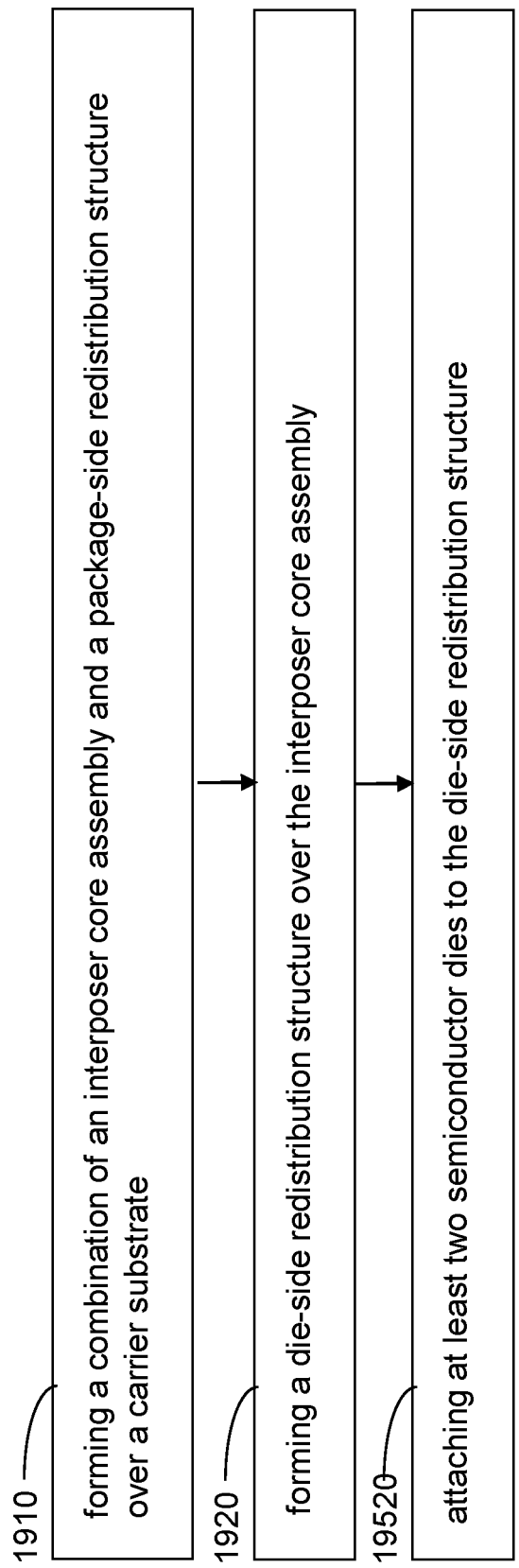
FIG. 19 is a flowchart illustrating steps for forming the exemplary structure according to an embodiment of the present disclosure.

Referring to FIG. 19, general processing steps for forming a chip package structure according to embodiments of the present disclosure are shown in a flow chart. Referring to step 1910, a combination of an interposer core assembly 430 and a package-side redistribution structure 410 is formed over a carrier substrate (300 or 330). The interposer core assembly 430 comprises at least one silicon substrate interposer 500 and an epoxy molding compound (EMC) interposer frame 432 that surrounds the at least one silicon substrate interposer 500. The at least one silicon substrate interposer 500 is connected to package-side redistribution wiring interconnects 414 within the package-side redistribution structure 410. Referring to step 1920, a die-side redistribution structure 440 is formed over the interposer core assembly 430. A combination of the package-side redistribution structure 410, the interposer core assembly 430, and the die-side redistribution structure 440 comprises an interposer structure 400. Referring to step 1930, at least two semiconductor dies (700, 800) are attached to the die-side redistribution structure 440. A subset of die-side redistribution wiring interconnects 444 within the die-side redistribution structure 440 provides chip-to-chip signal paths between the at least two semiconductor dies (700, 800).

In some embodiment, at least one silicon substrate interposer 500 is provided. A package-side redistribution structure 410 is formed over a carrier substrate 300. The at least one silicon substrate interposer 500 is attached to package-side redistribution wiring interconnects 414 within the package-side redistribution structure 410. An epoxy molding compound (EMC) interposer frame 432 is formed around the at least one silicon substrate interposer 500. An interposer core assembly 430 including the at least one silicon substrate interposer 500 and the EMC interposer frame 432 is formed. A die-side redistribution structure 440 is formed over the interposer core assembly 430. A combination of the package-side redistribution structure 410, the interposer core assembly 430, and the die-side redistribution structure 440 comprises an interposer structure 400. At least two semiconductor dies (700, 800) are attached to the die-side redistribution structure 440. A subset of die-side redistribution wiring interconnects 444 within the die-side redistribution structure 440 provides chip-to-chip signal paths between the at least two semiconductor dies (700, 800).

Referring to all drawings and according to various embodiments of the present disclosure, a chip package structure is provided, which comprises: an interposer structure 400 including, from one side to another, a package-side redistribution structure 410, an interposer core assembly 430, and a die-side redistribution structure 440, wherein the interposer core assembly 430 comprises at least one silicon substrate interposer 500, and each of the at least one silicon substrate interposer 500 comprises a respective silicon substrate 510, a respective set of through-silicon via (TSV) structures 514 vertically extending through the respective silicon substrate 510, a respective set of interconnect-level dielectric layers 562 embedding a respective set of metal interconnect structures 564, and a respective set of metal bonding structures 578 that are electrically connected to the die-side redistribution structure 440; at least two semiconductor dies (700, 800) that are attached to the die-side redistribution structure 440; and an epoxy molding compound (EMC) multi-die frame 960 that laterally encloses the at least two semiconductor dies (700, 800).

In one embodiment, each of the at least one silicon substrate interposer 500 comprises a respective set of backside bonding pads 538 that are bonded to the package-side redistribution structure 410 through a respective array of microbumps 416. In one embodiment, each array of microbumps 416 is laterally surrounded by a respective interposer underfill material portion 552 that contacts the package-side redistribution structure 410. In one embodiment, each set of metal bonding structures 578 directly contacts a respective subset of die-side redistribution wiring interconnects 444 within the die-side redistribution structure 440.

In one embodiment, the interposer core assembly 430 comprises an epoxy molding compound (EMC) interposer frame 432 that laterally surrounds, and laterally encloses, each of the at least one silicon substrate interposer 500. In one embodiment, each of the at least one silicon substrate interposer 500 has an areal overlap with a respective pair of semiconductor dies (700, 800) within at least two semiconductor dies (700, 800) in a see-through plan view; and each of the at least one silicon substrate interposer 500 provides lateral electrically conductive paths between the respective pair of semiconductor dies (700, 800).

In one embodiment, the interposer core assembly 430 comprises through-molding-compound via (TMCV) structures 436 that vertically extend through the EMC interposer frame 432 and electrically connecting a respective pair of a die-side redistribution wiring interconnect 444 within the die-side redistribution structure 440 and a package-side redistribution wiring interconnect 414 within the package-side redistribution structure 410. In one embodiment, interfaces between the TMCV structures 436 and the die-side redistribution wiring interconnects 444 are located within a horizontal plane including interfaces between each set of metal bonding structures 578 and the die-side redistribution wiring interconnects 444.

In one embodiment, the interposer core assembly 430 comprises an integrated passive device 600 that is embedded in the EMC interposer frame 432 and electrically connected to die-side redistribution wiring interconnects 444 within the die-side redistribution structure 440 or package-side redistribution wiring interconnects 414 within the package-side redistribution structure 410.

In one embodiment, one 700 of the at least two semiconductor dies (700, 800) comprises a system-on-chip (SoC) die; another 800 of the at least two semiconductor dies (700, 800) comprises a high bandwidth memory (HBM) die; and at least one set of metal interconnect structures 564 within the at least one silicon substrate interposer 500 is configured to provide electrically conductive paths that connect the SoC die and the HBM die, and are electrically isolated from package-side redistribution wiring interconnects 414 within the package-side redistribution structure 410.

In one embodiment, the at least two semiconductor die (700, 800) is attached to the die-side redistribution structure 440 through at least two arrays of solder material portions 490; at least one underfill material portion 492 laterally surrounds the at least two arrays of solder material portions 490; and at least one passive device component (811, 812) is attached to the die-side redistribution structure 440 and is embedded in the EMC multi-die frame 960.

In one embodiment, sidewalls of the EMC multi-die frame 960 are adjoined to, and are vertically coincident with, sidewalls of the interposer structure 400. The chip package structure may further comprise: a package substrate 200 that is attached to the interposer structure 400 via an array of interposer-to-package C4 solder balls 290; and a package-side underfill material portion 292 that laterally surrounds the array of interposer-to-package C4 solder balls 290 and contact the package substrate 200 and the interposer structure 400.

According to an embodiment of the present disclosure, a structure comprising an interposer structure 400 is provided. The interposer structure 400 comprises, from one side to another, a package-side redistribution structure 410, an interposer core assembly 430, and a die-side redistribution structure 440. The interposer core assembly 430 comprises at least one silicon substrate interposer 500, and an epoxy molding compound (EMC) interposer frame 432 embedding the at least one silicon substrate interposer 500. Each of the at least one silicon substrate interposer 500 comprises a respective silicon substrate 510, a respective set of throughsilicon via (TSV) structures 514 vertically extending through the respective silicon substrate 510, a respective set of interconnect-level dielectric layers 562 embedding a respective set of metal interconnect structures 564, and a respective set of metal bonding structures 578 that are electrically connected to the die-side redistribution structure 440. Each of the at least one silicon substrate interposer 500 comprises metal bonding structures 578 that are connected to the die-side redistribution wiring interconnects 444 of the die-side redistribution structure 440 via C4 bonding or C2 bonding.

In one embodiment, at least one set of metal interconnect structures 564 within the at least one silicon substrate interposer 500 is configured to provide electrically conductive paths that connect a respective pair of die-side redistribution wiring interconnects 444 within the die-side redistribution structure 440 and are electrically isolated from package-side redistribution wiring interconnects 414 located within the package-side redistribution structure 410.

The various structures and methods of the present disclosure may be used to provide a interposer structure 400 that may provide vertical high-speed high-bandwidth signal paths between multiple semiconductor dies (700, 800) and the package substrate 200, and high-speed high-bandwidth chip-to-chip connection paths to and from the multiple semiconductor dies (700, 800). The silicon substrate interposer(s) 500 embedded in the interposer structure 400 provide high density wiring to accommodate the wide bandwidth required for such signal connection paths.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a chip package structure, the method comprising:
    forming a combination of an interposer core assembly and a package-side redistribution structure over a carrier substrate, wherein the interposer core assembly comprises at least one silicon substrate interposer and a molding compound interposer frame that surrounds the at least one silicon substrate interposer, wherein one of the at least one silicon substrate interposer comprises metal bonding structures which are topmost components of vertical signal paths that vertically extend through said one of the at least one silicon substrate interposer;

forming a die-side redistribution structure comprising die-side redistribution wiring interconnects over the interposer core assembly, where the die-side redistribution wiring interconnects comprise via structures that are formed directly on surfaces of the metal bonding structures; and attaching at least two semiconductor dies to the die-side redistribution structure, wherein a first subset of die-side redistribution wiring interconnects within the die-side redistribution structure provides chip-to-chip signal paths between the at least two semiconductor dies.

2. The method of claim 1, wherein the at least one silicon substrate interposer is electrically connected to package-side redistribution wiring interconnects within the package-side redistribution structure.

3. The method of claim 1, wherein each of the at least one silicon substrate interposer comprises a respective set of through-silicon via (TSV) structures.

4. The method of claim 3, wherein each of the at least one silicon substrate interposer is attached to the package-side redistribution wiring interconnects via a respective array of interposer microbumps.

5. The method of claim 4, wherein the respective set of TSV structures electrically connect a respective subset of the package-side redistribution wiring interconnects and a respective subset of die-side redistribution wiring interconnects embedded in the die-side redistribution structure.

6. The method of claim 1, further comprising forming through-molding-compound via (TMCV) structures through the molding compound interposer frame, wherein the TMCV structures electrically connect a respective pair of a die-side redistribution wiring interconnect within the die-side redistribution structure and a package-side redistribution wiring interconnect within the package-side redistribution structure.

7. The method of claim 6, wherein the chip-to-chip signal paths between the at least two semiconductor dies are electrically isolated from the package-side redistribution wiring interconnects and from the TMCV structures.

8. The method of claim 1, further comprising forming a molding compound multi-die frame that laterally encloses the at least two semiconductor dies after attaching the at least one semiconductor die to the die-side redistribution structure.

9. The method of claim 8, further comprising:
testing electrical connections among the at least one silicon substrate interposer and the die-side redistribution wiring interconnects prior to attaching the at least two semiconductor dies to the die-side redistribution structure; and
bonding a combination of the interposer core assembly, the package-side redistribution structure, and the die-side redistribution structure to a package substrate such that the package-side redistribution structure faces the package substrate.

10. The method of claim 1, wherein:
each of the at least one silicon substrate interposer comprises the metal bonding structures; and
each of the at least one silicon substrate interposer is attached to die-side redistribution wiring interconnects of the die-side redistribution structure via controlled collapse chip connection (C4) bonding or via chip connection (C2) bonding which is solder bonding employing microbumps.

11. The method of claim 1, wherein:
the at least one silicon substrate interposer comprises a plurality of silicon substrate interposers; and
the method further comprises forming through-silicon via (TSV) structures in a silicon substrate.

12. The method of claim 11, further comprising:
forming metal interconnect structures embedded in interconnect-level dielectric layers on a front-side of the silicon substrate;
thinning a backside of the silicon substrate to physically expose backside surfaces of the TSV structures; and
dicing the silicon substrate and the interconnect-level dielectric layers into the plurality of silicon substrate interposers.

13. The method of claim 1, wherein a combination of a second subset of die-side redistribution wiring interconnects within the die-side redistribution structure and the vertical signal paths within said one of the at least one silicon substrate interposer provides signal paths between one of the at least two semiconductor dies and a subset of package-side redistribution wiring interconnects within the package-side redistribution structure.

14. A method of forming a chip package structure, the method comprising:
forming a package-side redistribution structure over a carrier substrate;
forming an interposer core assembly on a top surface of the package-side redistribution structure, wherein the interposer core assembly comprises at least one silicon substrate interposer and a molding compound interposer frame that surrounds the at least one silicon substrate interposer, wherein one of the at least one silicon substrate interposer comprises metal bonding structures which are topmost components of vertical signal paths that vertically extends through said one of the at least one silicon substrate interposer;
forming a die-side redistribution structure comprising die-side redistribution wiring interconnects over the interposer core assembly, where the die-side redistribution wiring interconnects comprise via structures that are formed directly on surfaces of the metal bonding structures; and
attaching at least two semiconductor dies to the die-side redistribution structure.

15. The method of claim 14, each of the at least one silicon substrate interposer comprises a respective silicon substrate, a respective set of through-silicon via (TSV) structures vertically extending through the respective silicon substrate, a respective set of interconnect-level dielectric layers embedding a respective set of metal interconnect structures. and a respective set of metal bonding structures that are electrically connected to the die-side redistribution structure upon formation of the die-side redistribution structure.

16. The method of claim 14, further comprising forming an epoxy molding compound (EMC) multi-die frame that laterally encloses the at least two semiconductor dies.

17. The method of claim 14, wherein a subset of die-side redistribution wiring interconnects within the die-side redistribution structure provides chip-to-chip signal paths between the at least two semiconductor dies.

18. A method of forming a chip package structure, the method comprising:

forming a package-side redistribution structure over a carrier substrate;

forming an interposer core assembly on a top surface of the package-side redistribution structure, wherein the interposer core assembly comprises at least one silicon substrate interposer, a molding compound interposer frame that surrounds the at least one silicon substrate interposer, and through-molding-compound via (TMCV) structures that vertically extend through the molding compound interposer frame;

forming a die-side redistribution structure over the interposer core assembly, wherein the TMCV structures electrically connect a respective pair of a die-side redistribution wiring interconnect within the die-side redistribution structure and a package-side redistribution wiring interconnect within the package-side redistribution structure; and attaching at least two semiconductor dies to the die-side redistribution structure, wherein:

one of the at least two semiconductor dies comprises a system-on-chip (SoC) die;

another of the at least two semiconductor dies comprises a high bandwidth memory (HBM) die; and at least one set of metal interconnect structures within the at least one silicon substrate interposer is configured to provide electrically conductive paths that connect the SoC die and the HBM die, and are electrically isolated from package-side redistribution wiring interconnects within the package-side redistribution structure.

19. The method of claim 18, wherein:

the at least two semiconductor die are attached to the die-side redistribution structure through at least two arrays of solder material portions;

the method comprises applying at least one underfill material portion around the at least two arrays of solder material portions;

the method comprises attaching at least one passive device component to the die-side redistribution structure; and the method comprises forming a molding compound multi-die frame that laterally encloses the at least two semiconductor dies.

20. The method of claim 18, further comprising:

detaching the carrier substrate from the package-side redistribution structure;

attaching a package substrate to the package-side redistribution structure via an array of interposer-to-package controlled collapse chip connection (C4) solder balls; and applying a package-side underfill material portion around the array of interposer-to-package controlled collapse chip connection (C4) solder balls between the package substrate and the package-side redistribution structure.

* * * * *